United States Patent
Watanabe et al.

[11] Patent Number: 5,815,223
[45] Date of Patent: Sep. 29, 1998

[54] DISPLAY DEVICE HAVING A SILICON SUBSTRATE, A LOCOS FILM FORMED ON THE SUBSTRATE, A TENSILE STRESS FILM FORMED ON THE LOCOS FILM, AND TFTS FORMED ON THE TENSILE STRESS FILM

[75] Inventors: Takanori Watanabe, Atsugi; Mamoru Miyawaki, Isehara; Shunsuke Inoue, Yokohama; Tetsunobu Kochi, Hiratsuka, all of Japan

[73] Assignee: Canon Kabushiki Kaisha, Tokyo, Japan

[21] Appl. No.: 940,944

[22] Filed: Sep. 30, 1997

Related U.S. Application Data

[63] Continuation of Ser. No. 491,710, Jun. 19, 1995, abandoned.

[30] Foreign Application Priority Data

Jun. 20, 1994 [JP] Japan .................................. 6-137319
Jun. 20, 1994 [JP] Japan .................................. 6-137320
Jun. 20, 1994 [JP] Japan .................................. 6-137321

[51] Int. Cl.$^6$ ................... G02F 1/136; G02F 1/1333; H01L 23/58
[52] U.S. Cl. .............. 349/42; 349/43; 349/138; 257/640; 257/647; 257/649
[58] Field of Search ................ 349/42, 43, 47, 349/138; 257/59, 72, 640, 647, 649; 438/225, 297, 439

[56] References Cited

U.S. PATENT DOCUMENTS

| | | | |
|---|---|---|---|
| 4,477,962 | 10/1984 | Godejahn, Jr. ..................... | 257/647 |
| 4,746,961 | 5/1988 | Konishi et al. ..................... | 257/66 |
| 4,838,654 | 6/1989 | Hamaguchi et al. ................. | 359/59 |
| 5,218,232 | 6/1993 | Yuzurihara et al. ................. | 257/754 |
| 5,288,527 | 2/1994 | Jousse et al. ........................ | 437/241 |
| 5,308,779 | 5/1994 | Sarma .................................... | 437/40 |
| 5,412,240 | 5/1995 | Inoue et al. .......................... | 257/347 |
| 5,434,441 | 7/1995 | Inoue et al. .......................... | 257/347 |
| 5,471,330 | 11/1995 | Sarma .................................. | 257/72 |
| 5,644,370 | 7/1997 | Miyawaki et al. ................... | 349/47 |

FOREIGN PATENT DOCUMENTS

| | | |
|---|---|---|
| 0530972 | 3/1993 | European Pat. Off. . |
| 0574137 | 12/1993 | European Pat. Off. . |
| 63-155755 | 6/1988 | Japan . |

OTHER PUBLICATIONS

Drum et al., "A Low–Stress Insulation Film on Silicon by Chemical Vapor Depsoition", Journal of Applied Physics, vol. 39, No. 9, pp. 4458–4459, Aug. 1968.
Patent Abstracts of Japan, vol. 013 No. 285 (E–780), 29 Jun. 1989 &JP–A–01 068967 (Fujitsu Ltd) 15 Mar. 1989, *abstract*.
Patent Abstracts of Japan, vol. 017 No. 202 (E–1353), 20 Apr. 1993 & JP–A–04 345069 (Oki Electric Ind Co Ltd) 1 Dec. 1992, *abstract*.

*Primary Examiner*—William L. Sikes
*Assistant Examiner*—Walter Malinowki
*Attorney, Agent, or Firm*—Fitzpatrick, Cella, Harper & Scinto

[57] ABSTRACT

A display device including a liquid crystal held between an active matrix substrate made up by arranging thin film transistors thereon, each using polycrystalline silicon as a semiconductor layer, in one-to-one relation to intersections between a plurality of signal lines and a plurality of scan lines, and an opposite substrate opposed to the active matrix substrate, wherein the active matrix substrate includes a film having tensile stress disposed at least below or above the semiconductor layer.

8 Claims, 15 Drawing Sheets

DISPLAY DEVICE HAVING A SILICON SUBSTRATE, A LOCOS FILM FORMED ON THE SUBSTRATE, A TENSILE STRESS FILM FORMED ON THE LOCOS FILM, AND TFTS FORMED ON THE TENSILE STRESS FILM

This application is a continuation of application Ser. No. 08/491,710 filed Jun. 19, 1995, now abandoned.

BACKGROUND OF THE INVENTION

1. Field of the Invention

The present invention relates to a display device using liquid crystals, and more particularly to a display device using a substrate which includes thin film switching devices formed thereon, and a manufacture method for the display device.

2. Related Background Art

In display devices using liquid crystals, there has recently been a demand for producing a finer display image. Particularly, the so-called active matrix type display panel using thin film switching devices to drive pixels is relatively easy to increase the number of pixels and the number of gradation steps as compared with other types of liquid crystal display panels and, therefore, has achieved rapid technical development.

In general, thin film switching devices used in the active matrix type display panel are formed of thin film transistors (TFTs) mainly made of amorphous silicon (a-Si) for large-sized panels of five or more inches, and mainly made of polysilicon (p-Si) for small-sized panels less than five inches. FIG. 10 schematically shows a liquid crystal display panel using p-SiTFTs. A panel display circuit 305 including, as switching elements, p-SiTFTs arrayed in a matrix pattern is connected to a vertical shift register 303 and a horizontal shift register 304. TV video signals supplied from a video signal circuit 301 are written into pixels in the display circuit 305 through the vertical shift register 303 and the horizontal shift register 304. Denoted by 302 is a synch circuit for establishing the timed relationship between the two shift registers 303 and 304. It is a recent tendency to form the shift registers 303, 304 of p-TFTs which are also integrated in the same panel. FIG. 30 shows a section of a p-SiTFT. Source and drain regions each consisted of an $n^+$-type diffusion layer 1403 and an $n^-$-type diffusion layer 1407, for example, are formed in thin-film polysilicon on a quartz or glass substrate 1401. A channel between the source and drain regions is on-off controlled by applying a voltage to a gate electrode 1406 of polysilicon formed on both the regions with the intervention of a gate insulating film 1405. The $n^-$-type diffusion layer 1407 is formed for the purpose of relieving the electric field just below the gate electrode, particularly, in the vicinity of the drain, and serves to effectively improve the source-drain leak current and withstand voltage of the TFT. Denoted by 1408 is a source/drain electrode made of, e.g., aluminum, 1410 is an interlayer insulating film made of, e.g., a silicon oxide film, and 1409 is a surface protection film made of, e.g., a silicon nitride film. An equivalent circuit of the foregoing liquid crystal panel is shown in FIG. 11. Pixel electrodes 406 are arranged in one-to-one relation to intersections between a plurality of signal lines 401A to 401D and a plurality of scan lines 402A to 402D, and a TFT 403 is connected at its drain to each of the pixel electrodes 406. The signal lines 401A to 401D are connected to respective sources of the TFTs 403 for each column, and the scan lines 402A to 402D are connected to respective gates of the TFTs 403 for each row. Video signals supplied through the signal lines 401A to 401D are written into the pixel electrodes 106. The drain of each TFT 403 is also connected to one electrode of a hold capacity 404 for holding the written charge for a sufficiently long period of time. The other electrode terminal 405 of the hold capacity 404 is connected to a potential common to all the pixels or the pixels for each row.

From the necessity of writing charges into each pixel for several micron seconds, the TFT is required to operate at a high speed. Known techniques for providing a p-Si thin film which can satisfactorily be used realize such a high-speed operation are as follows: (1) so-called long time annealing process wherein silane gas is decomposed by heat under reduced pressure to deposit p-Si which is then annealed for a long time at about 600° C. to develop grain-like p-Si on the order of several microns for increased carrier mobility, and (2) so-called hydrogenating process wherein silane gas is decomposed by heat under reduced pressure to deposit p-Si on which a film containing a plenty of hydrogen (e.g., a nitride film formed by the plasma CVD process) is deposited, followed by heat treatment to couple the hydrogen in the film to traps in the polysilicon boundary for increased carrier mobility.

However, the above conventional process have had the following technical problems to be solved. Specifically, since the long time annealing process of (1) requires a long time for processing, a throughput is reduced, which necessarily pushes up a cost in mass-production. For the hydrogenating process of (2), by way of example, the plasma nitride film 1409 used as the surface protection film, shown in FIG. 30, can be used as a supply source for hydrogen. After depositing the nitride film, heat treatment is performed in hydrogen gas for about 30 minutes at 450° C., for example, for diffusion of hydrogen. However, the carrier mobility of p-SiTFTs obtained by such a step is not sufficiently high and the rising characteristic of a current in the sub-threshold region is not satisfactory. Also, due to variations in the grain size of p-Si and changes in the process conditions, the carrier mobility and the rising characteristics are varied to a large extent, with a result of difficulty in producing p-SiTFTs which have sufficiently satisfactory characteristics. The use of unsatisfactory p-SiTFTs has raised characteristic limitations in making up circuits such as a shift register for driving pixels.

SUMMARY OF THE INVENTION

A primary object of the present invention is to provide a display device which can display a finer image with the increased number of pixels by using p-SiTFTs that have sufficiently high carrier mobility and a good on/off characteristic. Another object of the present invention is to provide a display device which has a stable membrane structure. Still another object of the present invention is to provide a transmission type liquid crystal display device which can display a finer image with the increased number of pixels. Still another object of the present invention is to provide a projection or spectacle type liquid crystal display device which can utilize light at a high rate and can display a finer image with the increased number of pixels.

To solve the technical problems explained above and to achieve the foregoing objects, the display device of the present invention is arranged as follows. According to the present invention, in a display device including a liquid crystal held between an active matrix substrate made up by arranging thin film transistors thereon, each using polycrystalline silicon as a semiconductor layer, in one-to-one relation to intersections between a plurality of signal lines and a plurality of scan lines, and an opposite substrate opposed to the active matrix substrate, the active matrix substrate includes a film having tensile stress disposed at least below or above the semiconductor layer. The present invention also involves a manufacture method for a display device. According to the present invention, in a manufacture method for a display device including a liquid crystal held between an active matrix substrate made up by arranging thin film transistors thereon, each using polycrystalline silicon as a semiconductor layer, in one-to-one relation to intersections between a plurality of signal lines and a plurality of scan lines, and an opposite substrate opposed to the active matrix substrate, the active matrix substrate is made up by arranging a film having tensile stress at least below or above the semiconductor layer. With the thus-arranged display device and manufacture method of the present invention, the foregoing objects are achieved.

The present invention involves various forms.

In one form of the present invention, the film having tensile stress may be disposed below a wiring layer for making up the signal line or the scan line which is in the lowermost position with respect to a layer of the liquid crystal layer as a reference.

In another form of the present invention, the polycrystalline silicon semiconductor layer may be sandwiched between a first film, having tensile stress, for suppressing diffusion of hydrogen and a second thin film for supplying hydrogen to the polycrystalline silicon. That is to say, the first film and the second film may be positioned one above the other with the intervention of the polycrystalline silicon therebetween.

With such arrangements, since the active matrix substrate includes a first thin film for suppressing diffusion of hydrogen and a second thin film for supplying hydrogen to polycrystalline silicon, these first and second films being positioned one above the other with the intervention of polycrystalline silicon therebetween, hydrogen to be coupled to silicon atoms in the polycrystalline silicon is supplied from one film, and the hydrogen once coupled to the silicon atoms is suppressed from diffusing by the other film. Therefore, hydrogen can remain stably in the polycrystalline silicon. As a result, the mobility and rising characteristic of the polycrystalline silicon can be improved to hold down variations in device characteristics. Further, the display device of the present invention can display a liquid crystal image in very high fineness. Additionally, due to a small leak current between the source and the drain, the pixel electrode can hold charges for a longer time, which results in a display image having a good contrast ratio.

The present invention involves the form in which the film having tensile stress is disposed in a particular position as follows. In this form, the display device includes a liquid crystal held between a semiconductor substrate, which has pixel electrodes arranged in one-to-one relation to intersections between a plurality of signal lines and a plurality of scan lines, has driving circuits provided in peripheral portions of the pixel electrodes for driving the respective pixel electrode, and is partly removed in portions below pixel display areas where the pixel electrodes are provided, allowing light to transmit through the semiconductor substrate to enter the pixel display areas, and an opposite substrate opposed to the active matrix substrate, wherein a field oxide film is provided below each of the pixel display areas of the semiconductor substrate so as to extend toward the peripheral portion where the driving circuit is provided, the removed part of the semiconductor substrate is positioned inwardly of a position at which the field oxide film terminates, and the film having tensile stress is disposed in the peripheral portion where the driving circuit is provided. With such arrangements, the mechanical strength is improved and a high-quality image can be displayed stably.

DETAILED DESCRIPTION OF THE PREFERRED EMBODIMENTS

Figure 1A:
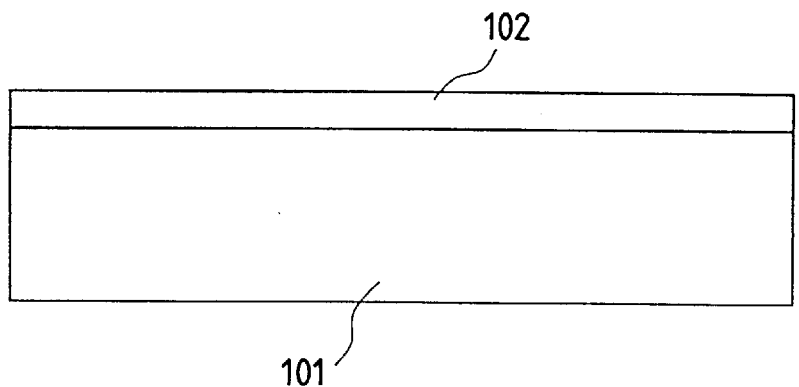
FIGS. 1A and 1B are schematic views showing one example of a semiconductor substrate in successive steps which can be applied to the display device of the present invention.
Figure 1B:
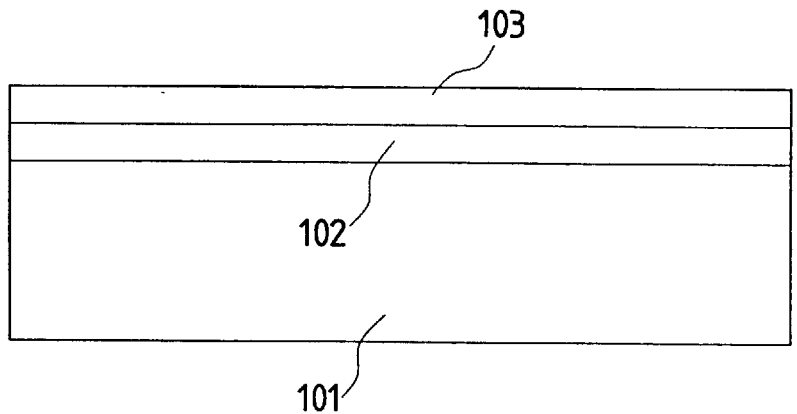
Figure 2A:
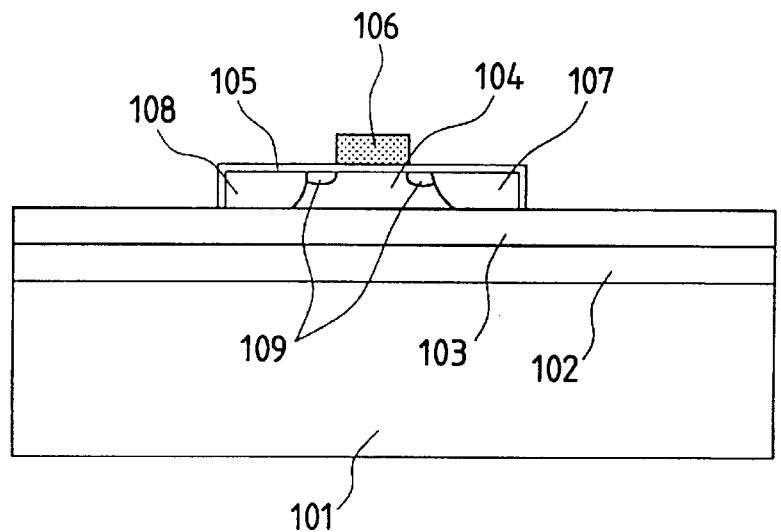
FIGS. 2A and 2B are schematic views showing the one example of a semiconductor substrate in subsequent successive steps which can be applied to the displays device of the present invention.
Figure 2B:
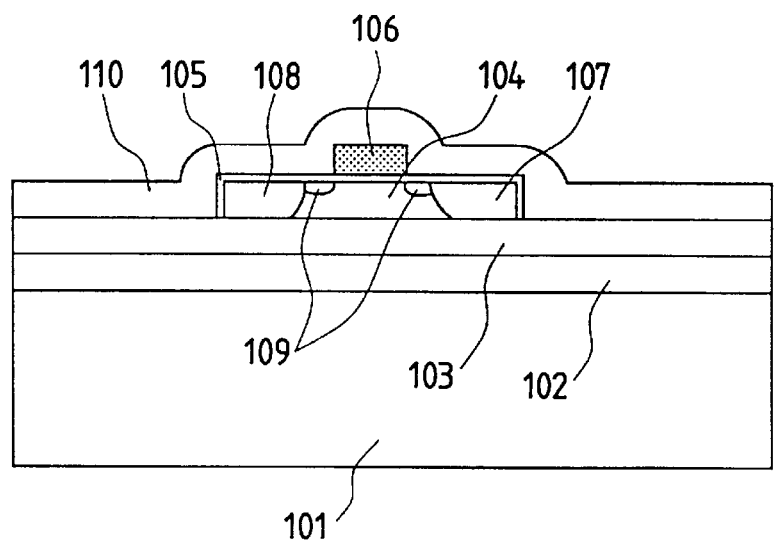

The display device of the present invention can be applied to various liquid crystal display devices such as of transmission, reflection, projection and spectacle types.

In the display device of the present invention, an active matrix substrate includes a first thin film for suppressing diffusion of hydrogen and a second thin film for supplying hydrogen to polycrystalline silicon, these first and second films being able to position one above the other with the intervention of polycrystalline silicon therebetween. With this arrangement, hydrogen to be coupled to silicon atoms in the polycrystalline silicon is supplied from one film, and the hydrogen once coupled to the silicon atoms is suppressed from diffusing by the other film. Therefore, hydrogen can remain stably in the polycrystalline silicon. As a result, the mobility and rising characteristic of the polycrystalline silicon can be improved to hold down variations in device characteristics.

In a preferred embodiment, the first and second films may be each formed of silicon nitride. By using a silicon nitride film formed by the plasma CVD process as the film for supplying hydrogen and a silicon nitride film formed by the reduced-pressure CVD process as the film for suppressing diffusion of hydrogen, for example, a very effective improvement can be achieved while using conventional semiconductor materials.

In a preferred embodiment, the first film may be formed of a film developing tensile stress for silicon, and the second film may be formed of a film developing compressive stress for silicon. In a transmission type liquid crystal display panel using a membrane structure, for example, by using a silicon nitride film formed by the reduced-pressure CVD process so that the compressive stress attributable to a silicon nitride film formed by the plasma CVD process or any other film (such as a silicon oxide film) is cancelled out, wrinkles and slacks of the membrane can be suppressed and, hence, superior characteristics of a TFT can be maintained.

In a preferred embodiment, the active matrix substrate may be formed of a glass or quartz substrate. Also, in a preferred embodiment, the active matrix substrate may be formed of a single crystal silicon substrate. In the latter case, by integrating both switching devices formed of single crystal silicon and pixel switching TFTs formed of polycrystalline on the substrate, the TFTs having better characteristics than conventional can be installed in a liquid crystal display panel with high-speed driving circuits. As a result, the panel can display an image at a higher degree of fineness.

In a preferred embodiment, part of a single crystal silicon substrate may be removed to provide a light transmissive substrate for application to a transmission type panel.

In a preferred embodiment, the active matrix substrate may be one including a scanning circuit at least part of which is made up by switching devices formed of single crystal silicon. In this case, by integrating both driving circuits formed of bulk silicon and pixel switching TFTs formed of polycrystalline on the substrate, a liquid crystal display panel with high-speed driving circuits can be provided.

In a preferred embodiment, the first and second films may be formed as ones substantially meeting the relationships below on an assumption that the first and second films have optical refractive indexes $n_1$, $n_2$ and thicknesses $d_1$, $d_2$, respectively, and the wavelength of light is is $\lambda$:

$$n_1 d_1 = N_1 \lambda/2$$

$$n_2 d_2 = N_2 \lambda/2$$

(where $N_1$ and $N_2$ are both natural numbers, not 0) By employing the first and second films meeting the above relationships, reflection of visible light entering a pixel region from the boundary surfaces between the first film and the other films vertically adjacent thereto is sufficiently suppressed. As a result, the light transmissivity of the panel is improved.

The present invention will be described below in detail in connection with preferred embodiments.

(Embodiment 1)

Figure 3:
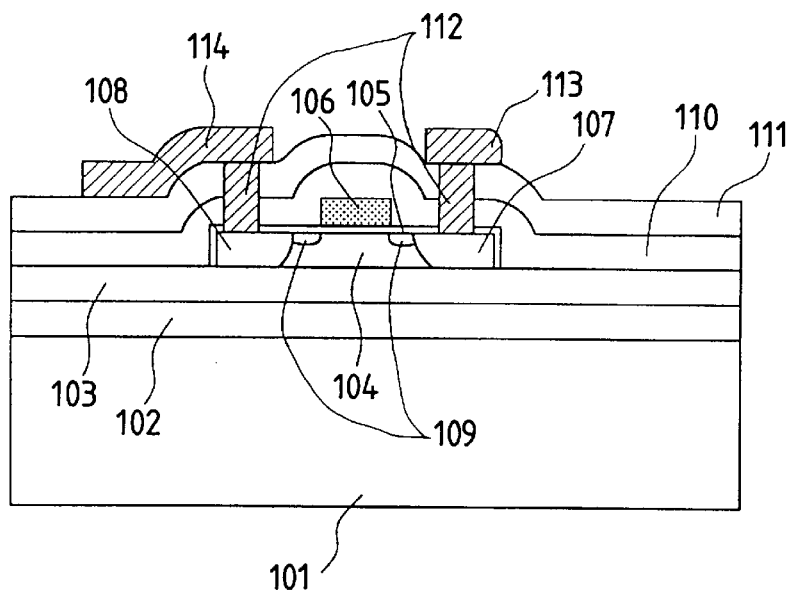
FIG. 3 is a schematic view showing the one example of a semiconductor substrate in a subsequent step which can be applied to the display device of the present invention.
Figure 4A:
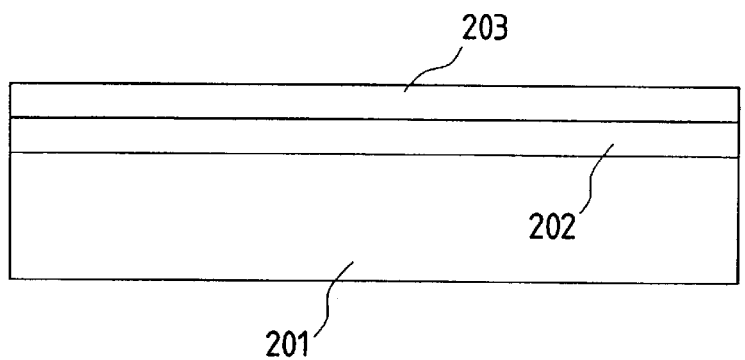
FIGS. 4A and 4B are schematic views showing an other example of a semiconductor substrate in successive steps which can be applied to the display device of the present invention.
Figure 4B:
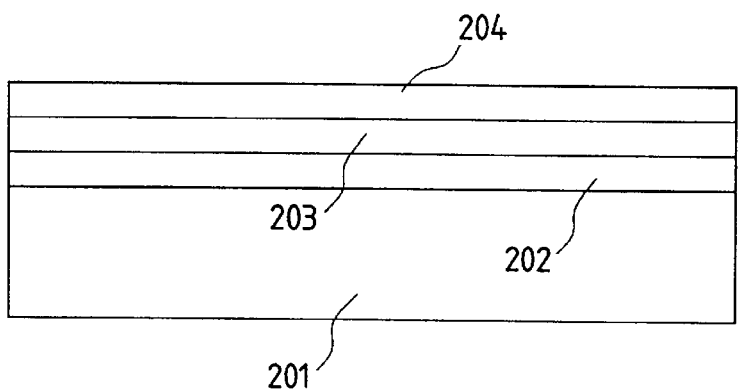
Figure 5A:
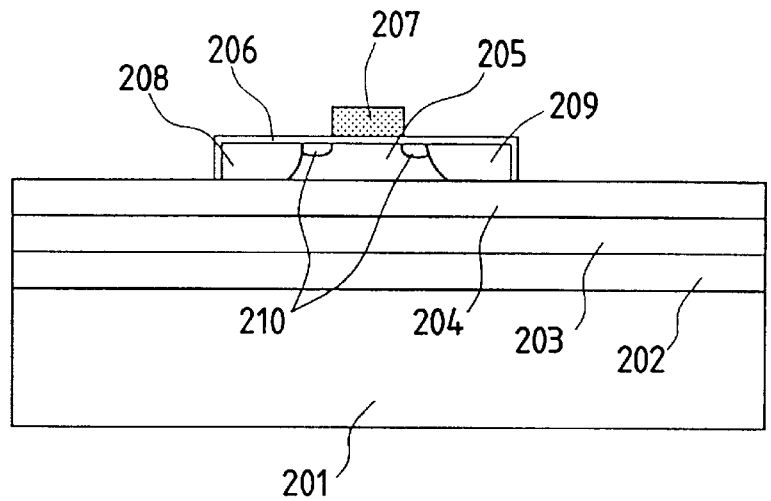
FIGS. 5A and 5B are schematic views showing the other example of a semiconductor substrate in subsequent successive steps which can be applied to the display device of the present invention.
Figure 5B:
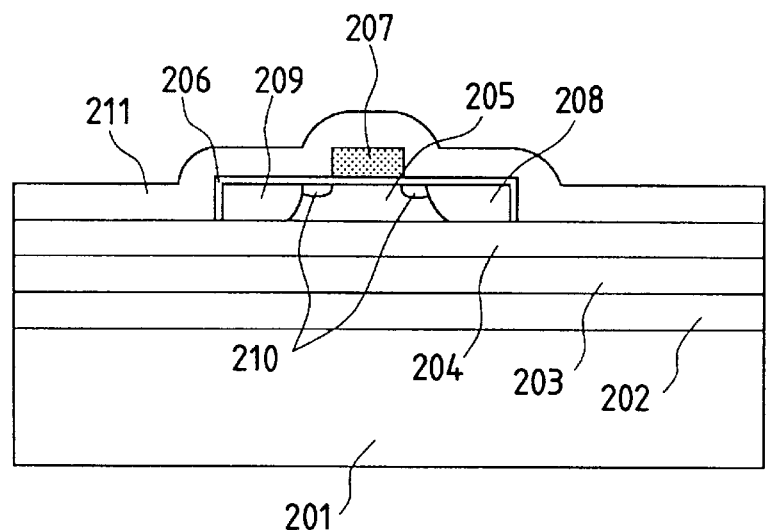
Figure 6:
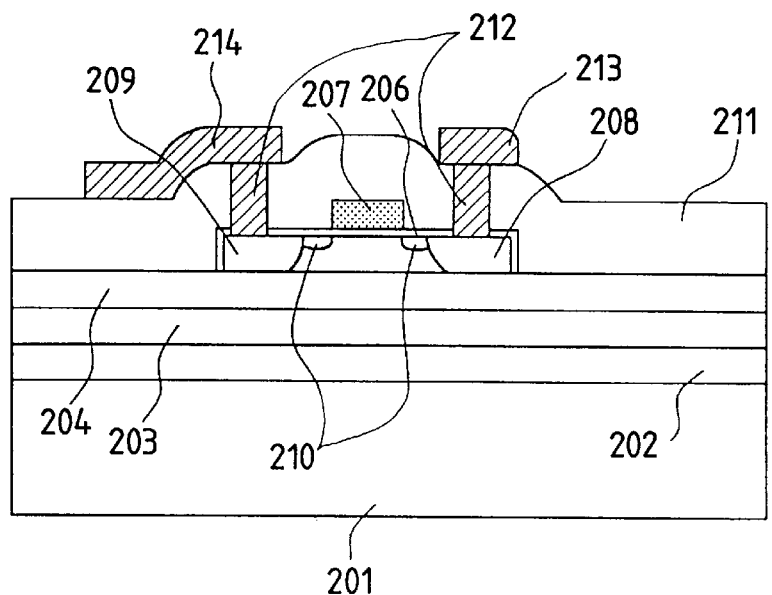
FIG. 6 is a schematic view showing the other example of a semiconductor substrate in a subsequent step which can be applied to the display device of the present invention.
Figure 7:
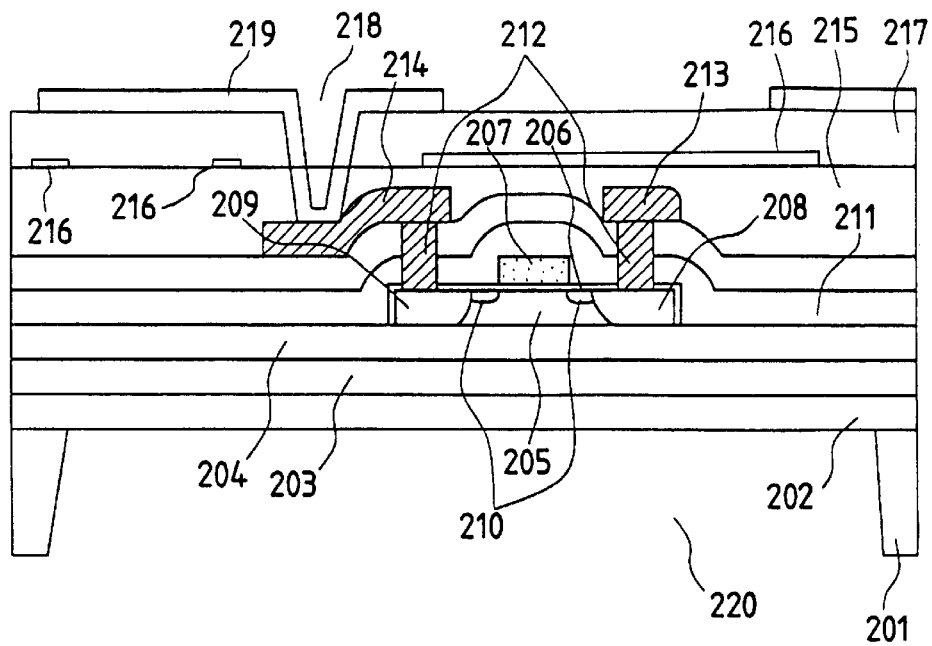
FIG. 7 is a schematic view showing the other example of a semiconductor substrate in a subsequent step which can be applied to the display device of the present invention.

A first embodiment will be described with reference to FIGS. 1A to 3. In FIGS. 1A to 3, denoted by 101 is a support base being of, e.g., a silicon substrate. The support base 101 serves as a base of a semiconductor substrate for holding a liquid crystal between itself and an opposite substrate. 102 is a silicon nitride film formed on the support base 101 by the reduced-pressure CVD process, the film 102 having tensile stress. After forming an oxide film 103 on the silicon nitride film 102, a polysilicon layer 104 is deposited and then thermally oxidized to form a gate insulating film 105. Further, polysilicon is deposited on the gate insulating film 105 to form a gate 106, and ions are implanted to the polysilicon layer 104 to form a source 108 and a drain 107. In this embodiment, to increase the source—drain withstand voltage and to reduce the leak current, the source 108 and the drain 107 are formed by using masks positioned to provide such an offset that the source and the drain are spaced from the gate electrode. Then, a low-concentration electric field relieving layer 109 is formed by implanting ions in a low concentration to the polysilicon layer 104 with self-alignment using the gate. Next, after depositing a PSG (Phospho-Silicate Glass) 110, a silicon nitride film 111 is deposited thereon by the plasma CVD process. Subsequently, contacts 112 and then metal wirings 113, 114 are formed so that transistor electrodes are wired for further electrical connection. As a result of the foregoing steps, the substrate of the structure shown in FIG. 3 is obtained. After that, additional upper layers are formed depending on functions of the display device to be manufactured. More specifically, on the substrate shown in FIG. 3, a pixel electrode connected to the drain of the transistor, a signal line connected to the source of the transistor, a scan line connected to the gate of the transistor, an orienting film, and so on are formed to provide a semiconductor substrate which holds a liquid crystal layer between itself and an opposite substrate. In this semiconductor substrate, a film having tensile stress, i.e., the silicon nitride film 111 formed by the plasma CVD process, is disposed below a wiring layer for making up the signal line or the scan line which is in the lowermost position with respect to the liquid crystal layer as a reference. Implantation of hydrogen atoms into polysilicon is effective to improve characteristics of a polysilicon transistor in points of reducing an off-current and increasing an on-current. In this embodiment, hydrogen atoms are diffused by annealing from the silicon nitride film 111 formed by the plasma CVD process into the polysilicon layer 104 for improving characteristics of the transistor. The annealing is advantageously performed at 350° C. to 550° C. for a period of about 10 minutes to 5 hours, but it may be performed, for example, at 450° C. for a period of about 30 minutes. As an alternative, the annealing may be performed by utilizing the heat history applied in any other suitable step. Carrying out the annealing in a further prolonged time is effective for further improvement. The annealing step can be made at any time after the silicon nitride film 111 has been formed. In this respect, it is desired to perform the annealing at the time at which other processes are not adversely affected. While the silicon nitride film 111 formed by the plasma CVD process is deposited on the PSG film 110 in this embodiment, it may be deposited anywhere so long as hydrogen can be diffused into the polysilicon layer 104. For example, the PSG film 110 may be replaced by the silicon nitride film 111. With this embodiment, since the silicon nitride film 102 formed by the reduced-pressure CVD process lies under the polysilicon layer 104, it serves to prevent hydrogen from diffusing downward from the polysilicon layer 104, enabling hydrogen atoms to be efficiently implanted into the polysilicon layer 104. As a result, a thin film transistor having a small off-current and a large on-current can be realized. When the semiconductor substrate thus produced is applied to a liquid crystal display device, the number of pixels can be increased to achieve a finer pixel array of the panel because of a reduction in the size of each transistor, and the contrast ratio and the number of gradation steps can be increased because of a reduction in the off-current.

The present invention is also applicable to liquid crystal display panels of the simple matrix type in addition to liquid crystal display panels of the so-called active matrix type using TFTs. Liquid crystal display panels of the simple matrix type include, for example, ones using a ferroelectric liquid crystal as the liquid crystal, and using MIM devices or PN junction devices as the pixel portions.

(Embodiment 2)

A second embodiment will be described with reference to FIGS. 4A to 7. In this embodiment, the present invention is applied to a transmission type liquid crystal display device. A support base 201 is formed of, e.g., a silicon substrate. After forming an oxide film 202 by thermal oxidation, a silicon nitride film 203 is formed by the reduced-pressure CVD process and a PSG film 204 is then deposited on the silicon nitride film 203, resulting in a structure shown in FIG. 4B. Subsequently, a transistor is formed thereon by similar steps in the above Embodiment 1. Denoted by 205 is a polysilicon layer, 206 is a gate insulating film, 207 is a gate electrode, 208 is a source, 209 is a drain, 210 is a low-concentration electric field relieving layer, 211 is a PSG film, 212 is a contact, and 213, 214 are metal wirings. Further, after forming an insulating film 215, a metal film 216 is formed. The metal film 216 is only required to be able to conduct electricity and shield light, and it can be formed of such a material as Ti, TiN or Al, for example. Subsequently, a silicon nitride film 217 is formed by the plasma CVD process. The substrate is then subjected to annealing so that hydrogen atoms are diffused from the silicon nitride film 217 formed by the plasma CVD process into the polysilicon layer 205 to improve characteristics of the transistor. After boring a through-hole 218, a pixel electrode 219 for applying a voltage to the liquid crystal is formed to be connected with the wiring 214. In this embodiment, the pixel electrode 219 is a transparent electrode and is formed of ITO. The metal film 216 is fixedly held at the peripheral potential of a display area and serves to establish a capacity between itself and the pixel electrode 219 for stabilizing a pixel electrode potential. Since the nitride film 217 is interposed between the pixel electrode 219 and the metal film 216, this embodiment has a merit of providing the larger capacity therebetween than the case of using an oxide film. However, the nitride film 217 may be replaced by any other suitable insulating film layer. Though not shown, a polyimide film is formed thereon, followed by rubbing to obtain a semiconductor substrate as one of paired substrates of a liquid crystal display device. A liquid crystal is sandwiched between the thus-obtained semiconductor substrate and an opposite substrate, thereby completing the liquid crystal display device. The opposite substrate comprises a support base, transparent electrodes, and a polyimide film subjected to rubbing. By arranging a color filter in the opposite substrate or on the semiconductor substrate including the pixel electrodes, a liquid crystal display device adapted for color display can be obtained. Further, the rear surface of the substrate 201 is partly etched so that the pixel display area is made transparent (as indicated by 220) to provide a transmission type display device. At this time, the oxide film 202 serves as an etching stop. When the substrate is partly thinned by etching the rear surface like in this embodiment, balance of stresses developed in the films of the thinned portion is important. If there exists stress acting in the direction to contract a film, this gives rise to a problem of causing wrinkles in the film. Conversely, if the tension of a film is too strong, this gives rise to a problem of tearing the film. One of materials causing tensile stress therein is a silicon nitride film formed by the reduced-pressure CVD process. However, if such a silicon nitride film formed by the reduced-pressure CVD process exists between the polysilicon layer 205 and the silicon nitride film 217 formed by the plasma CVD process, it would prevent diffusion of hydrogen atoms into the polysilicon layer 205 during the annealing, resulting in a disadvantage of no improvement in characteristics of the transistor. Therefore, the foregoing structure of the substrate according to this embodiment is advantageous for effective diffusion of hydrogen atoms. Fine adjustment of stresses in the films as required when partly thinning the substrate may be performed by setting initial design values such that the films slack slightly, and then etching the oxide film 202 by fluoric acid or the like. By forming driving circuits in areas where the substrate 201 is not thinned, though not shown, the driving circuits and the display areas can be both formed in an on-chip arrangement.

The driving circuits can be of a single MOS structure or a CMOS structure. Alternatively, the driving circuits may be formed of polysilicon. It is possible to reduce the number of masks and simplify the manufacture steps by simultaneously carrying out some of the processes necessary to form the driving circuits and some of the processes necessary to form the display areas which can be made in common.

With the display device thus manufactured, since the on-current of each transistor is increased, the transistor size can be reduced and, hence, the number of pixels can be increased to achieve a finer pixel array of the panel. Furthermore, because of a reduction in the off-current, the contrast ratio and the number of gradation steps can be increased.

While a silicon substrate is used as the support base in this embodiment, a transparent substrate such as a glass substrate may be used as the support base so that a liquid crystal display device may be manufactured without thinning the substrate in the display areas. In this case, a liquid crystal display device capable of displaying an image with a higher degree of fineness, the increased number of gradation steps, and a higher contrast ratio can also be provided because of improved transistor characteristics.

While this embodiment is described in connection with the transmission type liquid crystal display device, the present invention is also applicable to a reflection type liquid crystal display device. The reflection type is advantageous in obtaining a higher opening rate. Also, the silicon nitride film formed by the reduced-pressure CVD process provides a film having tensile stress in this embodiment. Besides the silicon nitride film, any other kind of film having tensile stress, such as a SiON film containing oxygen atoms or a laminated film of a SiON film and a silicon nitride film, can also be applied to the display device of the present invention.

Thus, according to this embodiment, the liquid crystal display device can be manufactured by the use of a semiconductor substrate including transistors of which on/off characteristics are efficiently improved by annealing. When this embodiment is applied to a transmission type display device using a support base which is made transparent by etching, it is possible to provide the display device in which films in etched portions are under proper tension and switching transistors have improved on/off characteristics. As a result, the liquid crystal display device capable of displaying an image with a higher degree of fineness, the increased number of gradation steps, and a higher contrast ratio can also be provided.

(Embodiment 3)

Figure 8:
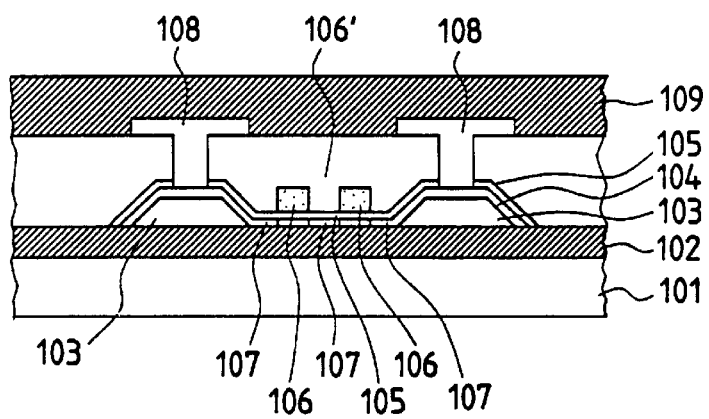
FIG. 8 is a schematic view showing one example of a TFT which can be applied to the display device of the present invention.

FIG. 8 is a schematic sectional view of an n$^+$p-SiTFT which can be employed in the display device of the present invention. Referring to FIG. 8, a silicon nitride film 102 is coated on a semiconductor or quartz substrate 101, and a channel, a source and a drain of the TFT are formed on the silicon nitride film 102. Denoted by reference numeral 103 is a high-concentration source/drain and 107 is a low-concentration source/drain for relieving an electric field. 105 is a gate insulating film formed of, e.g., a silicon nitride film, and 106 is polycrystalline silicon doped into n-type, for example. The so-called dual gate TFT having two gate electrodes at the same potential arranged in series between the source and the drain is thereby made up. 106' is an interlayer insulating film formed of, e.g., PSG (Phospho-Silicate Glass), and 108 is a source/drain electrode formed of, e.g., aluminum. 109 is a hydrogen supply source for hydrogenation which is formed of, e.g., a silicon nitride film. In this embodiment, the silicon nitride film 109 doubles as a surface protection film for preventing intrusion of moisture and impurities from the outside to thereby ensure reliability of the TFT. To accelerate hydrogenation, the silicon nitride film 102 is formed by the thermal CVD process in which silane gas is thermally decomposed under reduced pressure at a temperature of 600° to 900° C. The silicon nitride film 109 as a hydrogen supply source is formed by exciting a gas mixture of silane gas and ammonia gas or silane gas and N$_2$O (laughing gas) under reduced pressure at a temperature of 200° to 400° C. for decomposition and deposition thereof in plasma. It is important for the interlayer insulating film 106' to allow high-speed diffusion of hydrogen. Hydrogenation of polycrystalline silicon is progressed to some extent during deposition of the silicon nitride film 109. To achieve sufficient hydrogenation, however, it is preferable to perform heat treatment in hydrogen gas or a gas mixture of hydrogen gas and inert gas such as nitrogen gas at a temperature of 350° to 500° C. for 10 to 120 minutes after the deposition. An upper limit of the treatment temperature is determined depending on the melting point of the aluminum electrodes or the temperature causing a separating action of hydrogen. In the case of using aluminum, the heat treatment at a temperature not lower than 500° C. is not desired. The hydrogenating effect is also rather abated at a temperature not lower than 500° C. This is because the hydrogen once taken into the grain boundary of polycrystalline silicon separates again therefrom at such a temperature.

The TFT shown in FIG. 8 is manufactured as follows. First, silane gas and ammonia gas are reacted with each other under reduced pressure of 1 mm to 760 mm Torr to deposit the silicon nitride film 102 with a thickness of 100 to 400 nm on an oxidized surface of the silicon (or quartz) substrate 101. Next, silane gas diluted by nitrogen is thermally decomposed under pressure of 0.1 to 1.0 Torr at 600° to 700° C. to deposit a polycrystalline silicon film with a thickness of 50 to 400 nm, which is then patterned to form regions for the source/drain 103. This process is effective not only to reduce parasitic resistance of the source/drain regions, but also to prevent a second-layer polycrystalline silicon 104 from being lost by overetching when source/drain contact holes are etched. An additional silicon nitride film of about 10 to 200 nm may be formed on the silicon nitride film 102 so that the underlying silicon nitride 102 will not be etched during patterning of the first-layer polycrystalline silicon. Subsequently, after removing a naturally formed oxide film on the surface, the second-layer polycrystalline silicon 104 is deposited in a thickness of 50 to 200 nm by the reduced-pressure CVD process. It is desired that the thickness of the polycrystalline silicon is as thin as possible, because a leak current of the TFT is reduced correspondingly. In this embodiment, the thickness of the deposited polycrystalline silicon film was set to 80 nm, taking into account a subsequent step of forming a thermal oxide film with a thickness of 80 nm at 1150° C. and variations process by process. The gate oxide film may also be of an ONO (Oxidized-Nitrided Oxide) film obtained by forming an oxide film and then nitriding and oxidizing it successively. After forming the gate oxide film, polycrystalline silicon becoming the gate electrode is deposited in a thickness of 100 to 500 nm, followed by high-concentration doping and patterning to form the gate electrode 106. While phosphor ions were doped in a gas phase for doping of the gate electrode 106 in this embodiment, any other suitable known technique of implanting or doping arsenic or phosphor ions may be used instead. Subsequently, by using silane gas, oxygen gas and PH$_3$ (phosphine) as material gases, the interlayer insulating layer 106 of a PSG film is deposited in a thickness of 100 to 500 nm by the CVD process. The interlayer insulating layer 106 may be formed of, e.g., NSG (Non-Doped Silicate Glass) or BPSG (Boron-Phospho Silicate Glass). After boring contact holes, aluminum doped with silicon of 0.5 to 2.0% is deposited in a thickness of 100 to 600 nm by the magnetron sputtering process. Usable as electrode materials are general materials used in common semiconductor and TFT processes, for example, another kind of Al alloy, W, Ta, Ti, Cu, Cr, Mo, or silicide thereof. The deposited electrode material is patterned to form the source/drain electrodes 108. After that, a gas mixture of silane gas and $N_2O$ gas is decomposed in plasma at 200° to 400° C. to deposit the silicon nitride film 109 of 600 nm. Then, heat treatment is performed in hydrogen gas at 450° C. for 30 minutes. The TFT thus formed is applied to a liquid crystal display panel.

Figure 10:
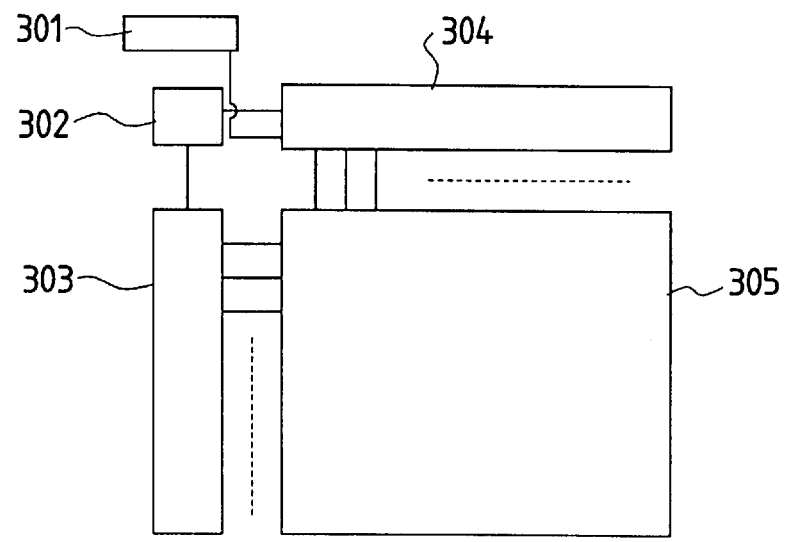
FIG. 10 is a schematic view showing one example of the display device of the present invention.

FIG. 10 schematically shows the liquid crystal display panel of this embodiment. A panel display circuit 305 including, as switching elements, p-SiTFTs arrayed in a matrix pattern is connected to a vertical shift register 303 and a horizontal shift register 304. TV video signals supplied from a video signal circuit 301 are written into pixels in the display circuit 305 through the vertical shift register 303 and the horizontal shift register 304. Denoted by 302 is a synch circuit for establishing the timed relationship between the two shift registers 303 and 304.

Figure 11:
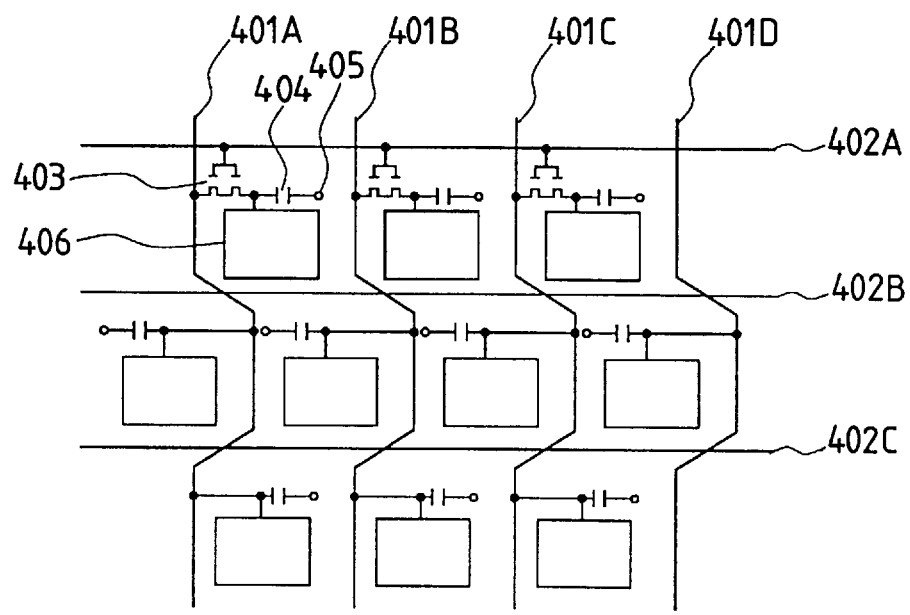
FIG. 11 is a diagram showing one example of an equivalent circuit of the display device of the present invention.

An equivalent circuit of the liquid crystal panel is shown in FIG. 11. Pixel electrodes 406 are arranged in one-to-one relation to intersections between a plurality of signal lines 401A to 401D and a plurality of scan lines 402A to 402D, and a TFT 403 is connected at its drain to each of the pixel electrodes 406. The signal lines 401A to 401D are connected to respective sources of the TFTs 403 for each column, and the scan lines 402A to 402D are connected to respective gates of the TFTs 403 for each row. Video signals supplied through the signal lines 401A to 401D are written into the pixel electrodes 106. The drain of each TFT 403 is also connected to one electrode of a hold capacity 404 for holding the written charge for a sufficiently long period of time. The other electrode terminal 405 of the hold capacity 404 is connected to a potential common to all the pixels or the pixels for each row.

Figure 12:
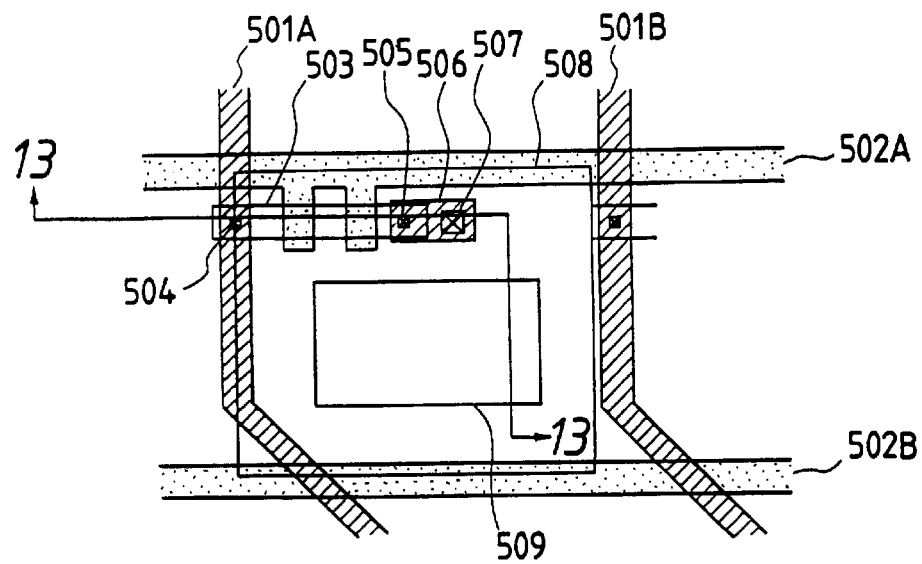
FIG. 12 is a schematic view showing one example of a pixel portion in the display device of the present invention.

FIG. 12 schematically shows a plan structure of the pixel portion. One pixel is surrounded by two signal lines 501A, 501B adjacent to each other and two scan lines 502A, 502B adjacent to each other. The source of the TFT formed of a polycrystalline silicon film 503 is connected to the signal line 501A through a contact hole 504 for writing signal charges into the drain of the TFT through the two gates. 505 is a contact for interconnecting the TFT and a metal electrode 506, and the metal electrode 506 is connected to a transparent pixel electrode 508 via a through-hole 507. In FIG. 12, 509 is an opening in a light shielding film which prevents unwanted light from entering the TFT.

Figure 13:
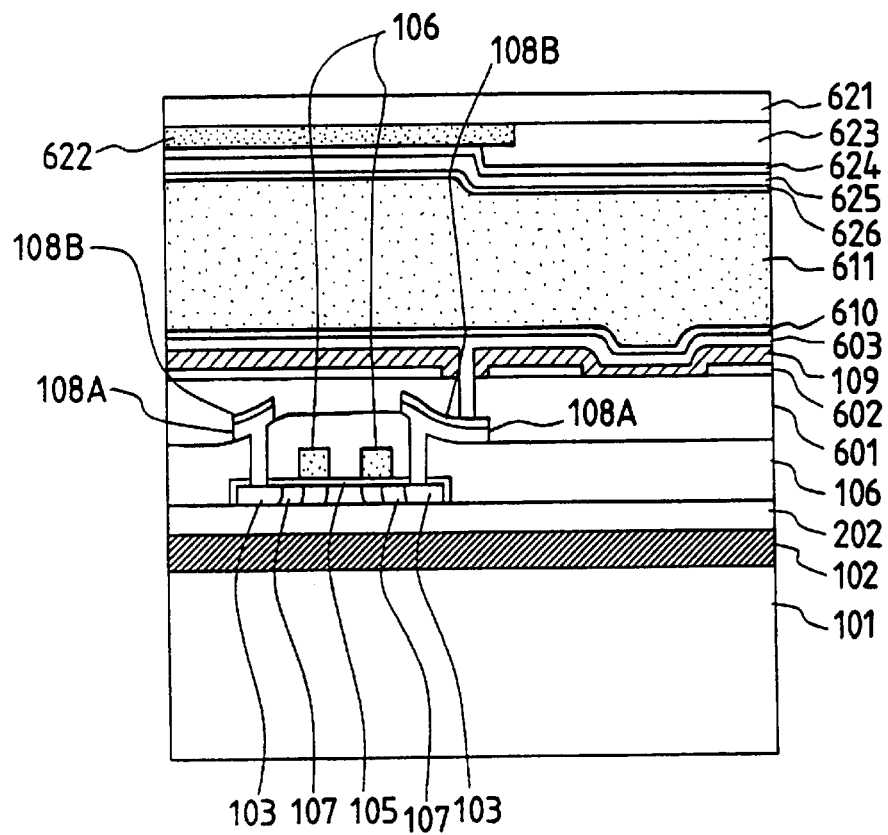
FIG. 13 is a schematic view showing one example of the display device of the present invention.

FIG. 13 is a sectional view taken along line 13—13 in FIG. 12. Referring to FIG. 13, a silicon nitride film 102 is coated on the silicon or quartz substrate 101. A silicon oxide film 202 of 10 to 100 nm is formed on the silicon nitride film 102 to separate the TFT from the silicon nitride film 102. The TFT has low-concentration n-type layers 107 for relieving an electric field and a high-concentration source/drain 103 which are in opposite relation to two polysilicon gate electrodes 106 with the intervention of a gate oxide film 105 therebetween. The source and drain electrodes 108 each comprise a laminated film of an Al film 108A and a Ti film 108B for easier ohmic connection to a pixel electrode 603. A light shielding film 602 is formed of, e.g., a TiN film and is separated from the source and drain electrodes with the intervention of, e.g., a PSG film 601 therebetween and from the TFT with the intervention of, e.g., a BPSG film 106" therebetween. In this embodiment, a plasma nitride film 109 for hydrogenation is disposed between the light shielding film 602 and the pixel electrode 603. This is because of the necessity of using a film having a relative dielectric constant as great as possible to establish a hold capacity between the pixel electrode 603 and the light shielding film 602. Thus, the hydrogenating effect can also sufficiently be achieved with the plasma nitride film disposed above the light shielding film. It is needless to say that the PSG film 601 may be replaced by a nitride film for hydrogenation. 610 is an orienting film formed of, e.g., a PIQ film for orienting a liquid crystal. An active matrix substrate is made up by the above-mentioned components starting from the substrate 101 and ending at the orienting film 610 shown in FIG. 13. A TN liquid crystal 611 is held between the active matrix substrate and an opposite substrate 621 on an undersurface of which an orienting film 626, a protection film 625 and a transparent electrode 624 are provided as shown. Further, a color filter 623 formed of pigments, for example, is disposed corresponding to an opening in the light shielding film 602, and a black matrix 622 formed of Cr, for example, is disposed corresponding to the remaining portion of the light shielding film 602.

With the liquid crystal display panel thus manufactured, the panel was able to display a finer liquid crystal image with pixel size not larger than 20 μm square. Also, a reduction in the source—drain leak current realized the panel having a prolonged charge hold time of the pixel electrode and a good contrast ratio. Furthermore, the number of defects such as white or black dots was small and the production yield was increased remarkably. These advantages are attributable to the following features of the TFT explained above: i.e., i) because of accelerated hydrogenation of polycrystalline silicon, carrier mobility of the TFT was increased 1.2 to 2 times that in the prior art and variations in the mobility were reduced down to a half or less of those in the prior art, resulting in the TFT adaptable for higher-speed operation with the same TFT size, and ii) the source—drain leak current of the TFT was reduced down to $\frac{1}{100}$ or less of that in the prior art, and those TFTs causing an abrupt increase in the leak current were produced in no way.

(Embodiment 4)

Figure 9:
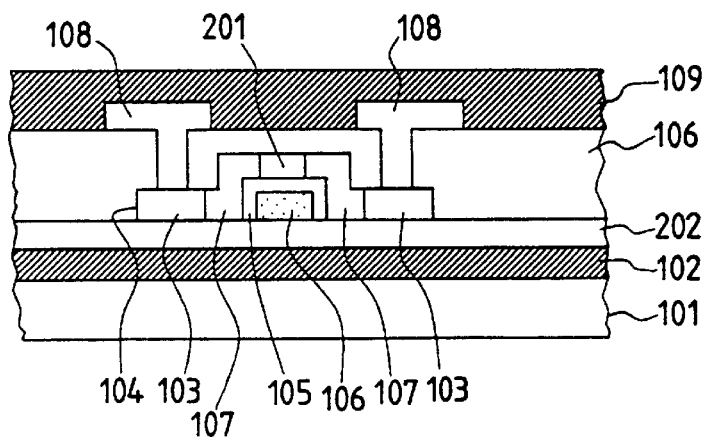
FIG. 9 is a schematic view showing another example of a TFT which can be applied to the display device of the present invention.

FIG. 9 is a schematic sectional view of the so-called bottom gate TFT having channel polysilicon positioned above a gate electrode, which TFT can be applied to the display device of the present invention. A silicon nitride film 102 is coated on a semiconductor, quartz or glass substrate 101, and a silicon oxide film 202 as an etching stop is formed on the silicon nitride film 102. As with the above Embodiment 1, the TFT may have a structure having no silicon oxide film 202. 106 is a gate electrode of the TFT formed of, e.g., n$^+$-type polycrystalline silicon. Of course, such a metal as Al, Cr, Ta, TaN or Ti can also be used as the gate electrode. 105 is a gate insulating film formed of, e.g., a silicon oxide film, and 201 is a channel portion formed of polycrystalline silicon. The channel portion 201 may be formed of an Al2O3 film, a SiN film, or a laminated film thereof. 107 is an n-type electric field relieving region of low concentration and 103 is a source/drain region of high concentration. Of course, the TFT may be of p-type. 106" is an interlayer insulating film formed of, e.g., BPSG and 108 is a metal electrode for the source/drain. 104 is polysilicon and 109 is a silicon nitride film.

As with the Embodiment 3, the two silicon nitride films 109 and 102 serve respectively to supply hydrogen and prevent diffusion of hydrogen. As explained in connection with the Embodiment 3, it is desired that at least one of the two silicon nitride films is a film formed by the plasma CVD process, which is effective as a supply source for hydrogen. On the other hand, the film for effectively preventing diffusion of hydrogen is advantageously a silicon nitride film formed by the reduced-pressure CVD process or the thermal CVD process.

As a result of manufacturing a liquid crystal display panel similar to that of the Embodiment 3 by using the TFT structure of this embodiment, the same advantages as in the Embodiment 3 were confirmed. Additional advantages below were also confirmed in this embodiment. The silicon nitride film formed by the plasma CVD process, which is effective as a supply source for hydrogen, can double as a surface protection film. Also, since the channel portion is close to the silicon nitride film formed by the plasma CVD process, the hydrogenating effect can be enhanced and matching between the manufacture processes can be improved.

(Embodiment 5)

Figure 18:
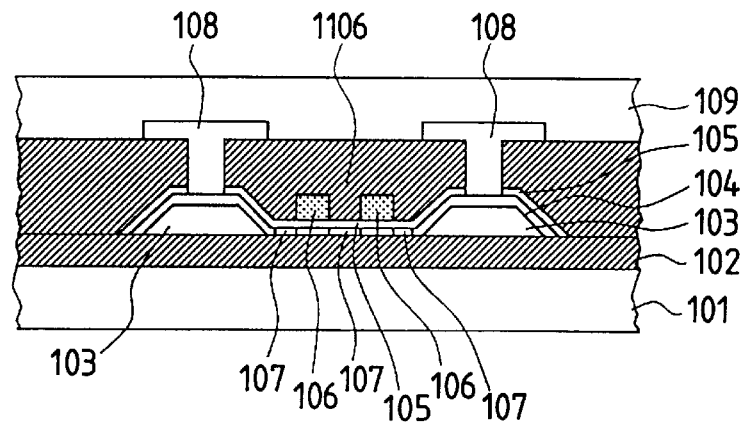
FIG. 18 is a schematic view showing another example of a TFT which can be applied to the display device of the present invention.

FIG. 18 is a schematic view of a TFT which can be applied to the display device of the present invention. In this embodiment, a hydrogen supply source for hydrogenation is disposed below a metal electrode. This TFT has the same sectional structure as in the above Embodiment 3. Accordingly, a substrate 101, a silicon nitride film 102, a high-concentration source/drain region 103, an electric field relieving region 107, a gate electrode 106, a gate insulating film 105, a source/drain metal electrode 108, etc. can be formed by using the materials and the processes described above in connection with the Embodiment 3.

This embodiment is different from the Embodiment 3 in that an interlayer insulating film 1106 between the gate electrode and the Al metal electrode is used as a supply source for hydrogen. By way of example, the interlayer insulating film 1106 was formed of a silicon nitride film formed by the plasma CVD process and having a thickness of 800 nm in this embodiment. This thickness was determined in consideration of the parasitic capacity between wirings and a probable incidence of short-circuit failures, and can be changed with a certain degree of freedom. The film having a thickness not less than 10 nm can sufficiently function as the supply source for hydrogen. When aluminum is used for the electrode and a sufficient selection ratio is not provided in patterning, an etching stop layer, e.g., a silicon oxide film, having a thickness not less than 50 nm may be formed on the silicon nitride film (PCVD). Additionally, 109 is a surface protection film formed of PSG, BPSG, SiON or NSG, as well as a silicon nitride film formed by the plasma CVD process.

As a result of manufacturing a liquid crystal display panel similar to that of the Embodiment 3 by using the TFT structure of this embodiment, the same advantages as in the Embodiment 3 were confirmed. Furthermore, in this embodiment, the hydrogenating effect was developed remarkably because of the TFT being almost completely covered by the supply source for hydrogen and the layer for preventing diffusion of hydrogen. Also, characteristics of the TFT used in this embodiment were very stable even with long-time heat treatment for hydrogenation.

(Embodiment 6)

Figure 19:
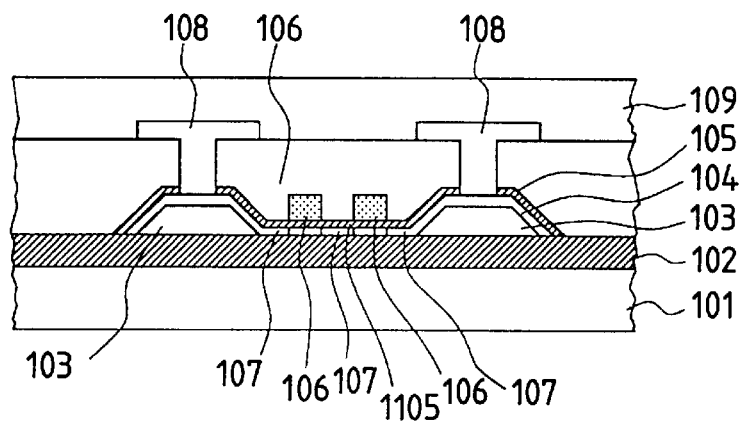
FIG. 19 is a schematic view showing still another example of a TFT which can be applied to the display device of the present invention.

FIG. 19 is a schematic view of a TFT which can be applied to the display device of the present invention. In this embodiment, a supply source for hydrogen or a film for preventing diffusion of hydrogen is used as a gate insulating film. This TFT has the same sectional structure as in the above Embodiment 3. Accordingly, a substrate 101, a silicon nitride film 102, a high-concentration source/drain region 103, an electric field relieving region 107, a gate electrode 106, a interlayer insulating film 106', a source/drain metal electrode 108, etc. can be formed by using the materials and the processes described above in connection with the Embodiment 3. As described before in connection with the Embodiment 3, a gate insulating film 1105 may be formed of an ONO film. In this embodiment, 102 was formed of a silicon nitride film by the thermal CVD process, and the gate insulating film was formed of a silicon nitride film by the plasma CVD process. A thickness of the gate insulating film is preferably in the range of 10 nm to 200 nm. By way of example, 150 nm was selected for matching with threshold values of the TFT. As an alternative, the gate insulating film may be of a laminated film of a silicon nitride film and a silicon oxide film. Particularly, when polycrystalline silicon is used as the gate electrode 106, a thin silicon oxide film, for example, is preferably provided as an etching stop during the patterning just below the gate electrode.

The structure of this embodiment is applicable to a P-channel TFT, an N-channel TFT, and a bottom gate TFT like the Embodiment 2.

As a result of manufacturing a liquid crystal display panel similar to that of the Embodiment 3 by using the TFT structure of this embodiment, the same advantages as in the Embodiment 3 were confirmed. Furthermore, in this embodiment, the hydrogenating effect was developed remarkably because of the TFT being almost completely covered by the supply source for hydrogen and the layer for preventing diffusion of hydrogen. Also, no need of using a nitride film having a high dielectric constant as the interlayer insulating film enables the circuit to be driven at a high speed.

(Embodiment 7)

Figure 14:
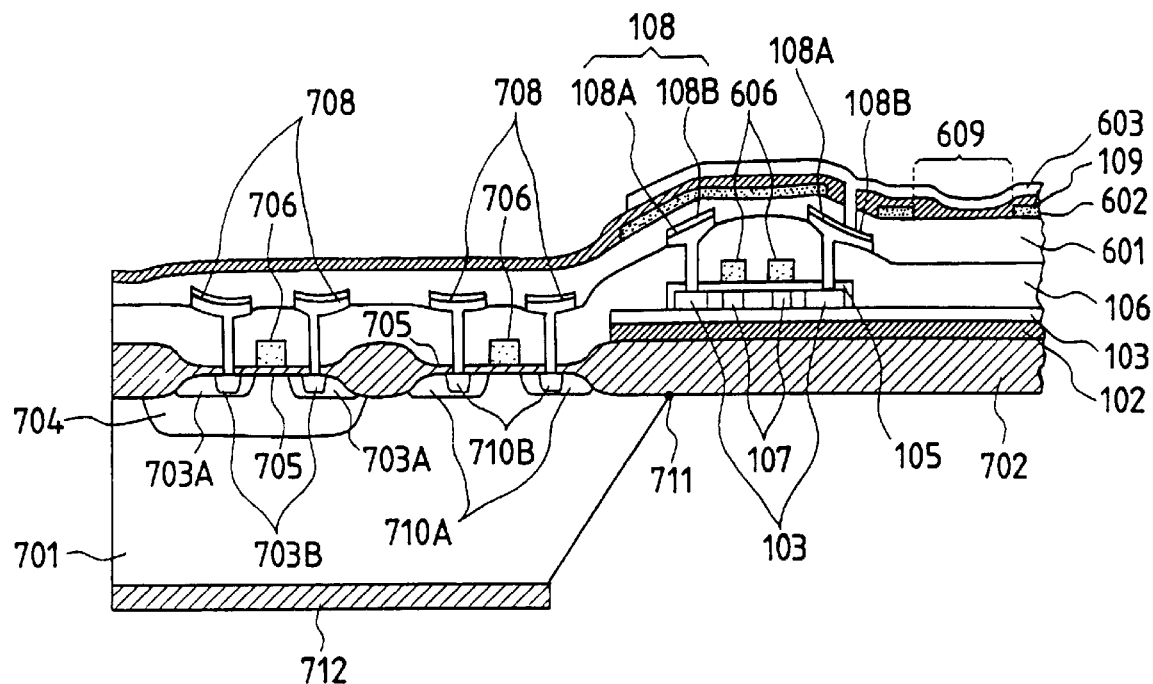
FIG. 14 is a schematic view showing one example of an active matrix substrate which can be applied to the display device of the present invention.

A seventh embodiment will be described with reference to FIG. 14. FIG. 14 is a sectional view of an active matrix substrate (TFT substrate) of a transmission type liquid crystal display device in which the TFT shown in the Embodiment 3 is used as a pixel driving switch, and a signal line driving circuit and a scan line driving circuit, including a shift register, are integrated in bulk silicon. The circuit in the bulk silicon is of a CMOS structure, but not limited to the illustrated structure. Referring to FIG. 14, 701 is a silicon substrate, 702 is a thick oxide film for device separation, 703A is a low-concentration source/drain of an NMOS transistor, and 703B is a high-concentration source/drain of the NMOS transistor. 704 is a p-type well of the NMOS transistor, 705 is a gate oxide film, 706 is a polysilicon gate electrode, and 708 is a source/drain electrode. 710A is a low-concentration source/drain of a PMOS transistor, 710B is a high-concentration source/drain, and 712 is an oxide film on the rear surface of the substrate. The TFT portion has the same structure as shown in FIG. 13 and will not be hence described here. To construct a transmission type display panel, the substrate silicon is removed in the TFT portion. 711 is an etching end which defines the size of a display area. The oxide film 712 serves as an etching mask used when removing the substrate silicon. The portion below the thick oxide film 702 is etched away.

Figure 15:
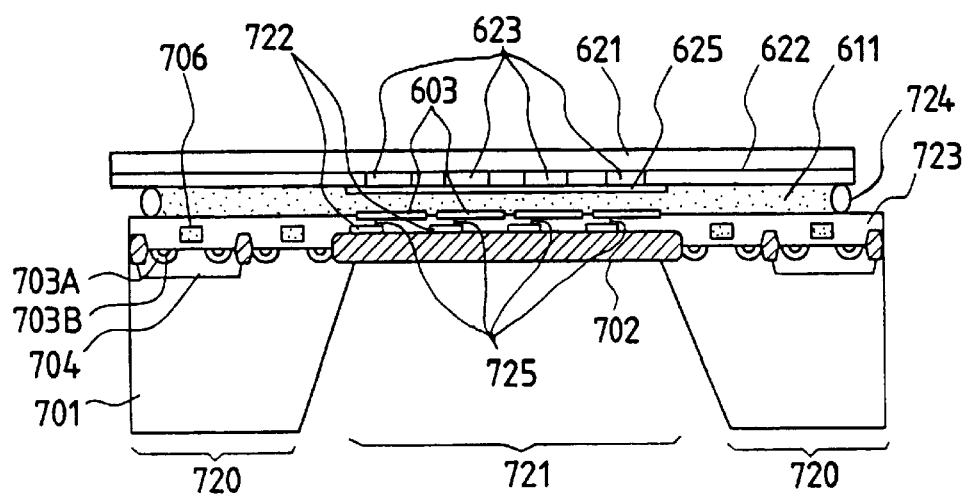
FIG. 15 is a schematic view showing another example of the display device of the present invention.

FIG. 15 shows a section of the liquid crystal display device in which the TFT substrate of FIG. 14 is mounted. In FIG. 15, 720 is a support comprising substrate silicon, and 721 is a transparent area where the substrate silicon is etched away and which becomes a display area of the panel. 722 is TFT, and 725 is a portion connecting a pixel electrode 603 with the TFT. Identical components to those in FIG. 14 are denoted by the same reference numerals and will not be described here. The TFT substrate shown in FIG. 14 is disposed parallel to an opposite substrate 621 with a liquid crystal material 611 sealed between the two substrates. A spacer 724 is provided so that the liquid crystal material 611 is maintained at a thickness designed in consideration of optical characteristics of the liquid crystal. A transparent common electrode 625 common to all the pixels or the pixels for each row is disposed in a position opposite to pixel electrodes 603 for applying a voltage to the liquid crystal. Since this embodiment is adapted for a full-color display panel, color filters 623 formed of dyes or pigments are arranged on the opposite substrate 621, whereas the remaining portions between the pixels and above peripheral driving circuits are shielded against light by a black matrix 622. The liquid crystal material 611 is preferably of a TN (Twist-Nematic) liquid crystal, but may be of an STN (Super Twist-Nematic) liquid crystal, an FLC (Ferroelectric Liquid Crystal), or a PDLC (Polymer-Diffused Liquid Crystal) from the structural viewpoint. In the case of using a TN or STN liquid crystal or an FLC, polarizing plates are required to be disposed above and below the display device in the crossed Nichol state. A backlight necessary for display may be irradiated from above or below as viewed in FIG. 15. To sufficiently shield light, the backlight is advantageously irradiated from above in the structure of this embodiment. Film arrangements in the display area shown in FIG. 14 include inventive measures below for the purpose of improving panel characteristics of this embodiment.

Figure 20:
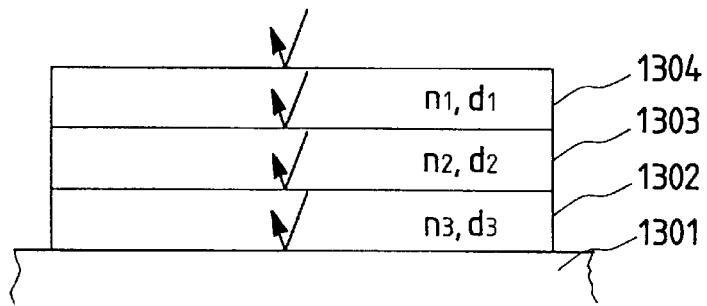
FIG. 20 is a schematic view for explaining a film structure of an active matrix substrate which can be applied to the display device of the present invention.

(i) Measure for minimizing reflection of light caused by differences in refractive index between a film and adjacent films above and below it: Generally, as shown in FIG. 20, when layers 1301, 1302, 1303 and 1304 having different refractive indexes are superposed one above another, light is reflected by each interface between the adjacent layers. It is known that the reflection is minimized by properly selecting refractive indexes $n_1$, $n_2$, $n_3$ and thicknesses $d_1$, $d_2$, $d_3$ of the layers 1302, 1303, 1304. It was found that an optimum condition for the layer 1304 is $n_1 d_1 = N_1 \lambda/2$ (where $N_1$ is a natural number, not 0). If thicknesses of the layers can be determined independently of each other, optimum conditions for the other layers are likewise given by:

$$n_2 d_2 = N_2 \lambda/2$$

$$n_3 d_3 = N_3 \lambda/2$$

(where $N_2$ and $N_3$ are both natural numbers, not 0) The wavelength $\lambda$ of light is preferably selected to, e.g., 550 nm at which relative visibility of the human eyes is maximum. The silicon nitride film 102 formed by the thermal CVD process and the silicon nitride film 109 formed by the plasma CVD process, which are used in this embodiment and hence in the Embodiment 3, each had the refractive index of n=2.0. Given $\lambda$=550 nm, the film thickness is expressed below from the above equation:

$$d = N \times 550/(2 \times 2.0) = N \times 137.5 \text{ (nm)}$$

In this embodiment, the silicon nitride film 102 formed by the thermal CVD process was set to a thickness of 400 nm near 412.5 nm corresponding to N=3, and the silicon nitride film 109 formed by the plasma CVD process was set to a thickness of 270 nm near 275 nm corresponding to N=2. Even if an error from the calculated value is on the order of 10%, the effect of suppressing the reflection is sufficiently developed. Also, N may be set to an other suitable value than the above design values in this embodiment.

(ii) Measure for optimizing tension of a membrane: Tension of a membrane is determined by balance between compressive stresses and tensile stresses developed in respective films comprising the membrane with respect to the silicon substrate. In the film arrangements of this embodiment, the LOCOS oxide film 702 produces maximum compressive stress such an extent that it causes a warp of 45 μm even for a 5-inch wafer when the film thickness is 800 nm, for example. On the other hand, the silicon nitride film formed by the thermal CVD process produces maximum tensile stress such an extent that it causes a warp of 60 μm when the film thickness is 400 nm, for example. Since a total warp of the other films is about 15 μm due to compressive stress, a total warp of all the films becomes about 0 μm. Taking into account a reduction in the thickness of the LOCOS oxide film caused when the silicon is partly removed by etching, slight tensile stress finally remains so that the membrane is held under highly reliable tension. Of course, design values are not limited to the above ones shown by way of example, but the thickness of the LOCOS oxide film may be changed within the range of 200 to 1500 nm and the thickness of the nitride film may be changed within the range of 10 to 60 nm as a matter of design choice.

With this embodiment, a liquid crystal display device having the larger number of gradation steps and a higher contrast ratio than conventional was obtained. Particularly, because of a single crystal silicon substrate of high quality being used to form driving circuits, not only a reduction in size of the display device, but also an improvement in yield were achieved. Further, a display device having an increased yield of the membrane manufacture steps, high reliability, high transmissivity by virtue of reduced reflection of light, and high display quality was provided.

(Embodiment 8)

Figure 16:
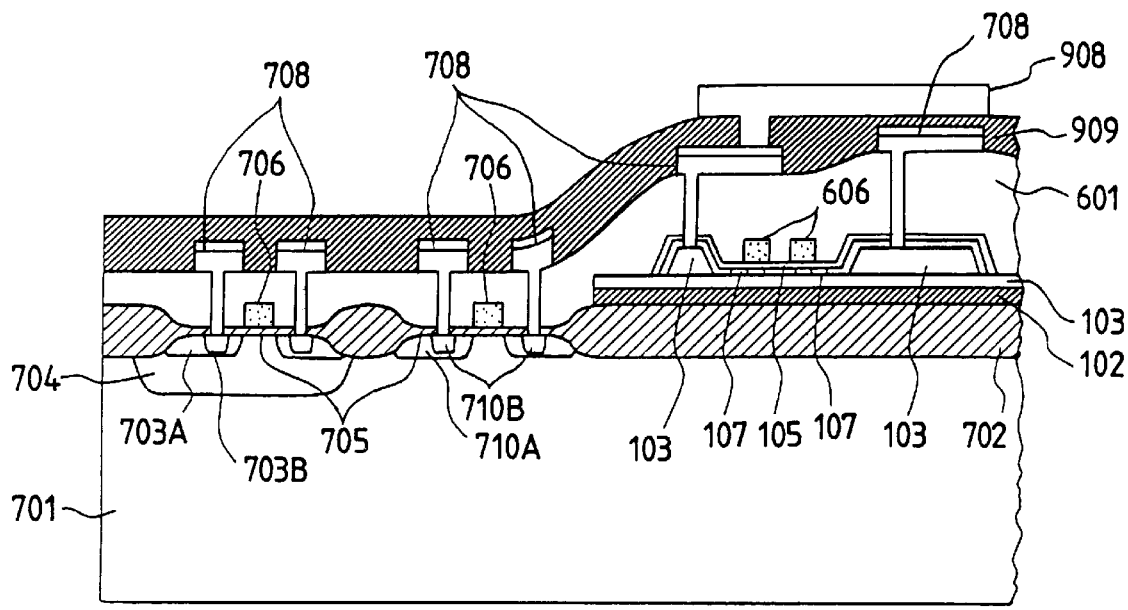
FIG. 16 is a schematic view showing another example of an active matrix substrate which can be applied to the display device of the present invention.
Figure 17:
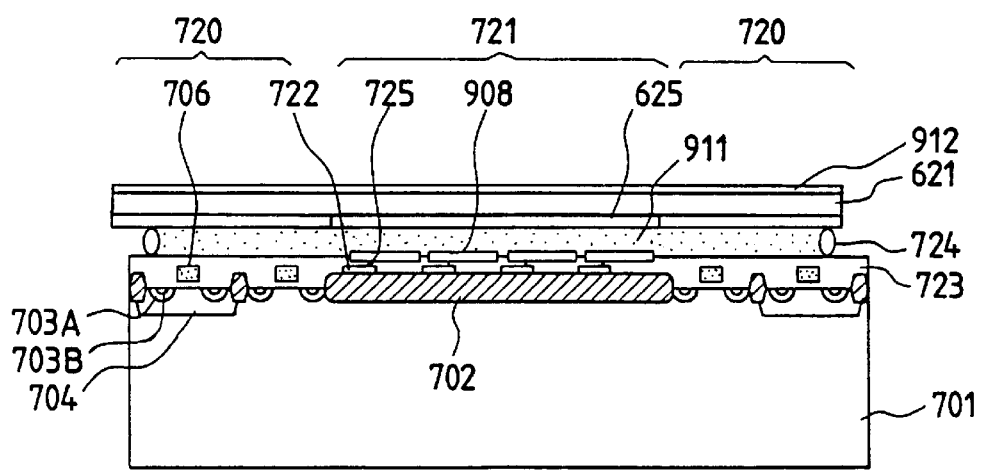
FIG. 17 is a schematic view showing still another example of the display device of the present invention.

This embodiment is to construct a reflection type liquid crystal display device using an active matrix substrate shown in FIG. 16. The active matrix substrate shown in FIG. 16 is similarly structured to the substrate shown in FIG. 14 except that the former substrate has no portion hollowed or partly removed by etching, and includes an opaque metal electrode 908 for reflecting incident light. 909 is a silicon nitride film which is formed by the plasma CVD process and doubles as a passivation film here. A reflection type liquid crystal display device as shown in FIG. 17 was manufactured by using the active matrix substrate thus structured. Unlike the transmission type liquid crystal display device shown in FIG. 15, the liquid crystal display device shown in FIG. 17 has no hollowed portion through which incident light transmits, and reflects the incident light by the opaque metal electrode 908 for displaying an image. In FIG. 17, 911 is a liquid crystal and 912 is a polarizer. In this embodiment, a liquid crystal panel was manufactured by using a TN type as the liquid crystal, and the incident light was condensed by using a polarizing beam splitter to display an image. The resulting image was superior in having the increased number of gradation steps and a higher contrast ratio.

(Embodiment 9)

A liquid crystal display device was manufactured by omitting the polarizer 912 from the liquid crystal display device shown in FIG. 17. Then, in this embodiment, a liquid crystal panel was manufactured by using a PDLC (Polymer-Diffused Liquid Crystal) as the liquid crystal, and an image was displayed by using a Schlieren optical system. The resulting image was superior in having the increased number of gradation steps and a higher contrast ratio.

(Embodiment 10)

A projection type liquid crystal display device was manufactured by combining each of the liquid crystal display devices shown in FIGS. 15 and 17 with a magnifying optical system. A superior image was also obtained in this embodiment.

(Embodiment 11)

A so-called spectacle type liquid crystal display device was manufactured by assembling each of the liquid crystal display devices shown in FIGS. 15 and 17 in spectacles. The manufactured display device was able to display the same image in both right and left panels, or a stereoscopic image by the right and left panels. An image obtained in this embodiment was good.

(Embodiment 12)

A schematic view of a liquid crystal display panel of this embodiment is shown in FIG. 10. A panel display circuit 305 including, as switching elements, p-SiTFTs arrayed in a matrix pattern is connected to a vertical shift register 303 and a horizontal shift register 304. TV video signals supplied from a video signal circuit 301 are written into pixels in the display circuit 305 through the vertical shift register 303 and the horizontal shift register 304. Denoted by 302 is a synch circuit for establishing the timed relationship between the two shift registers 303 and 304.

Figure 23:
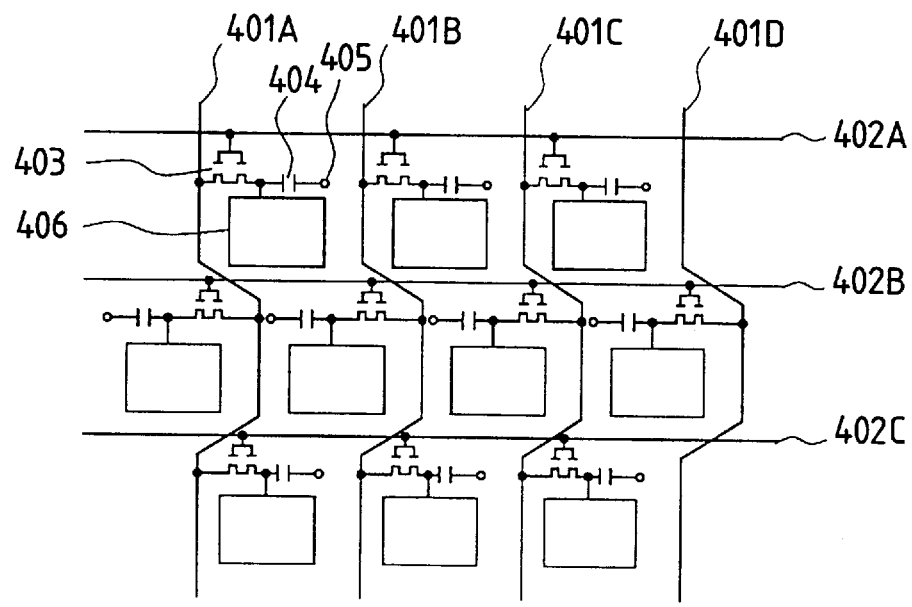
FIG. 23 is a diagram showing one example of an equivalent circuit of the display device of the present invention.

An equivalent circuit of the liquid crystal panel is shown in FIG. 23. Pixel electrodes 406 are arranged in one-to-one relation to intersections between a plurality of signal lines 401A to 401D and a plurality of scan lines 402A to 402D, and a TFT 403 is connected at its drain to each of the pixel electrodes 406. The signal lines 401A to 401D are connected to respective sources of the TFTs 403 for each column, and the scan lines 402A to 402D are connected to respective gates of the TFTs 403 for each row. Video signals supplied through the signal lines 401A to 401D are written into the pixel electrodes 106. The drain of each TFT 403 is also connected to one electrode of a hold capacity 404 for holding the written charge for a sufficiently long period of time. The other electrode terminal 405 of the hold capacity 404 is connected to a potential common to all the pixels or the pixels for each row. While this embodiment is described in connection with the liquid crystal display device of the so-called active matrix type using TFTs, the present invention is not limited to this type of display device, but also applicable to liquid crystal display panels of the simple matrix type using, for example, MIM devices or PN junction devices arranged in one-to-one relation to the intersections between the signal lines and the scan lines.

Figure 24:
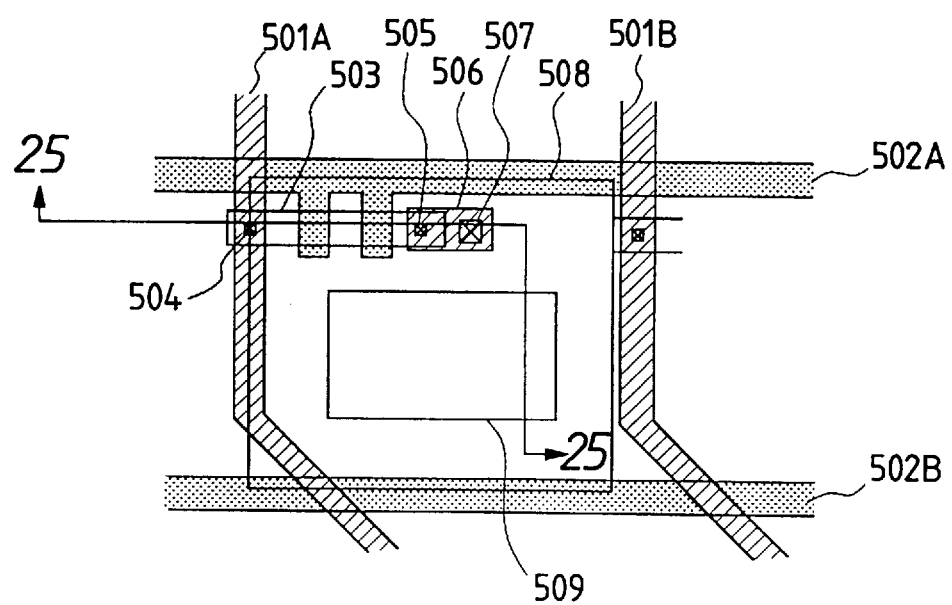
FIG. 24 is a schematic view showing one example of a pixel portion in the display device of the present invention.

FIG. 24 schematically shows a plan structure of a pixel portion. One pixel is surrounded by two signal lines 501A, 501B adjacent to each other and two scan lines 502A, 502B adjacent to each other. The source of the TFT formed of a polycrystalline silicon film 503 is connected to the signal line 501A through a contact hole 504 for writing signal charges into the drain of the TFT through two gates. 505 is a contact for interconnecting the TFT and a metal electrode 506, and the metal electrode 506 is connected to a transparent pixel electrode 508 via a through-hole 507. In FIG. 24, 509 is an opening in a light shielding film which prevents unwanted light from entering the TFT.

Figure 25:
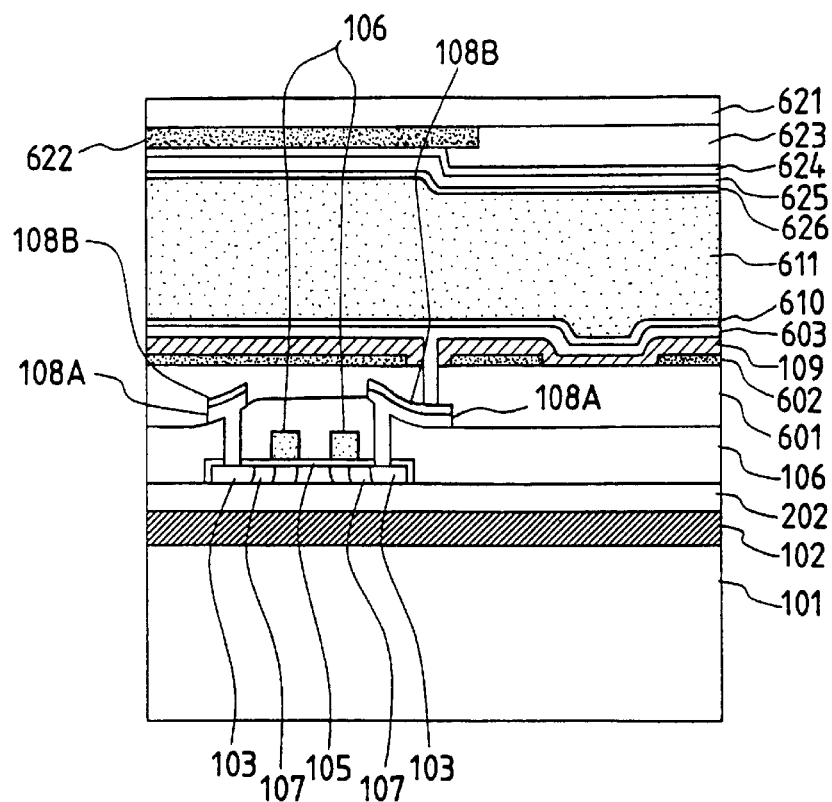
FIG. 25 is a schematic view showing still another example of a semiconductor substrate which can be applied to the display device of the present invention.

FIG. 25 is a sectional view taken along line 25—25 in FIG. 24. Referring to FIG. 25, a silicon nitride film 102 is coated on the silicon or quartz substrate 101. A silicon oxide film 202 of 10 to 100 nm is formed on the silicon nitride film 102 to separate the TFT from the silicon nitride film 102. The TFT has low-concentration n-type layers 107 for relieving an electric field and a high-concentration source/drain 103 which are in opposite relation to two polysilicon gate electrodes 106 with the intervention of a gate oxide film 105 therebetween. The source and drain electrodes 108 each comprise a laminated film of an Al film 108A and a Ti film 108B for easier ohmic connection to a pixel electrode 603. A light shielding film 602 is formed of, e.g., a TiN film and is separated from the source and drain electrodes with the intervention of, e.g., a PSG film 601 therebetween and from the TFT with the intervention of, e.g., a BPSG film 106" therebetween. 610 is an orienting film formed of, e.g., a PIQ film for orienting a liquid crystal. An active matrix substrate is made up by the above-mentioned components starting from the substrate 101 and ending at the orienting film 610 shown in FIG. 25. A TN liquid crystal 611 is held between the active matrix substrate and an opposite substrate 621 on an undersurface of which an orienting film 626, a protection film 625 and a transparent electrode 624 are provided as shown. Further, a color filter 623 formed of pigments, for example, is disposed corresponding to an opening in the light shielding film 602, and a black matrix 622 formed of Cr, for example, is disposed corresponding to the remaining portion of the light shielding film 602.

Figure 22:
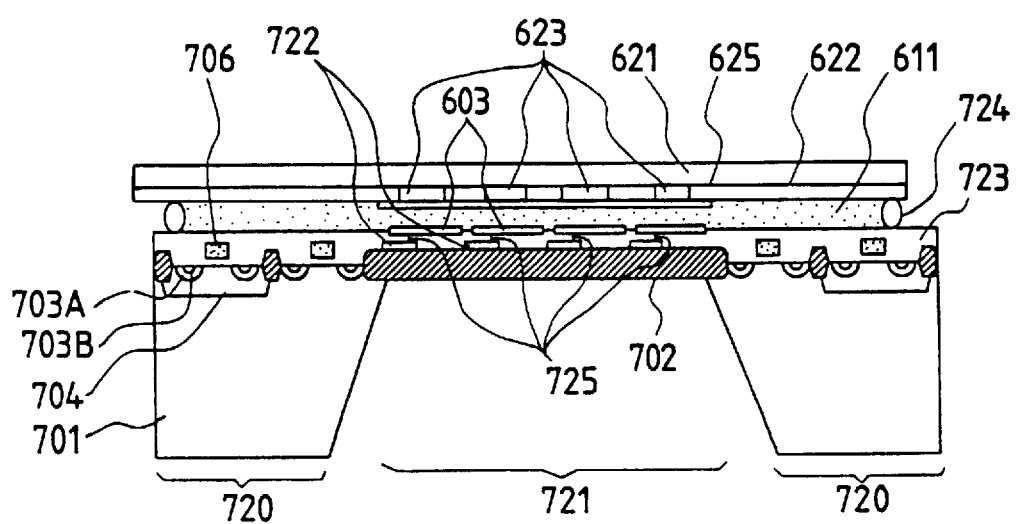
FIG. 22 is a schematic view showing still another example of the display device of the present invention.

FIG. 22 shows a section of the liquid crystal display panel of this embodiment, including a pixel display area and a peripheral driving circuit portion. Referring to FIG. 22, 701 is a silicon substrate, 702 is a thick oxide film (field oxide film) for device separation, 703A is a low-concentration source/drain of an NMOS transistor, and 703B is a high-concentration source/drain of the NMOS transistor. 704 is a p-type well of the NMOS transistor and 706 is a polysilicon gate electrode. 720 is a support comprising substrate silicon, and 721 is a transparent area where the substrate silicon is etched away and which becomes a display portion (pixel display area) of the panel. The TFT substrate (semiconductor substrate) shown in FIG. 22 is disposed parallel to an opposite substrate 621 with a liquid crystal material 611 sealed between the two substrates. A spacer 724 is provided so that the liquid crystal material 611 is maintained at a thickness designed in consideration of optical characteristics of the liquid crystal. A transparent common electrode 625 common to all the pixels or the pixels for each row is disposed in a position opposite to pixel electrodes 603 for applying a voltage to the liquid crystal. Since this embodiment is adapted for a full-color display panel, color filters 623 formed of dyes or pigments are arranged on the opposite substrate 621, whereas the remaining portions between the pixels and above peripheral driving circuit portions are shielded against light by a black matrix 622. The liquid crystal material 611 is preferably of a TN (Twist-Nematic) liquid crystal, but may be of an STN (Super Twist-Nematic) liquid crystal, an FLC (Ferroelectric Liquid Crystal), or a PDLC (Polymer-Diffused Liquid Crystal) from the structural viewpoint. In the case of using a TN or STN liquid crystal or an FLC, polarizing plates are required to be disposed above and below the display device in the crossed Nichol state. A backlight necessary for display may be irradiated from above or below as viewed in FIG. 22.

Figure 21:
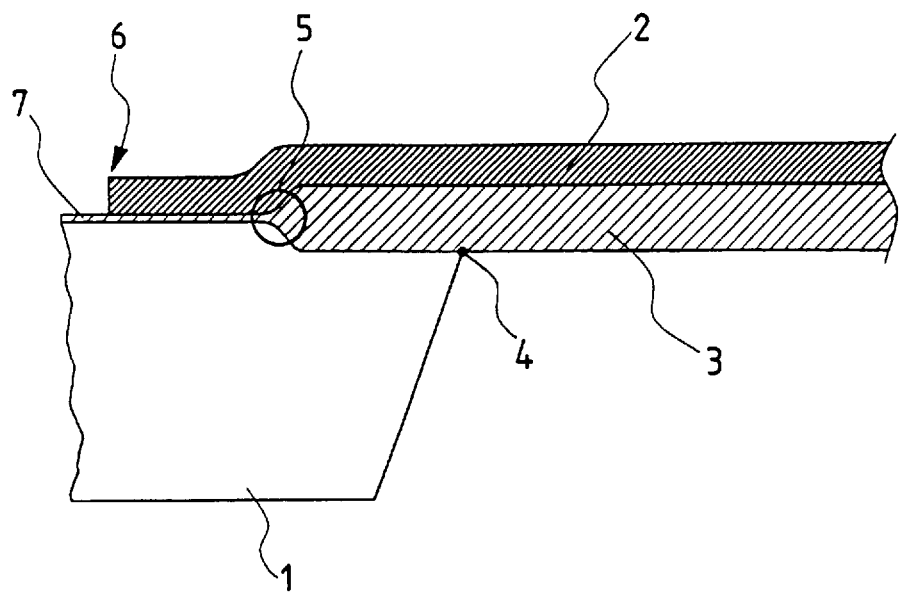
FIG. 21 is a schematic view showing still another example of a semiconductor substrate which can be applied to the display device of the present invention.

FIG. 21 schematically shows the vicinity of a portion of the TFT substrate (semiconductor substrate) shown in FIG. 22 where the silicon is removed. Referring to FIG. 21, 1 is a Si substrate, 2 is a SiN film formed by the reduced-pressure CVD process, 3 is a field oxide film, and 4 is an end position of the portion of the TFT substrate (semiconductor substrate) where the Si substrate 1 has been partly etched away to form a transparent pixel display area. 5 denotes a portion at which the field oxide film 3 terminates in a bird's beak shape, as shown in FIG. 21, when it is formed by the LOCOS process. 6 denotes an end of the SiN film 2 formed by the reduced-pressure CVD process, and 7 denotes a thin oxide film. Generally, the field oxide film 3 is a film having compressive stress and hence would cause a slack if it is not laminated with another film having tensile stress. In this embodiment, therefore, a film having tensile stress, i.e., the SiN film 2 formed by the reduced-pressure CVD process is disposed adjacent to the field oxide film 3, as shown in FIG. 21, for relieving the moment applied to the field oxide film 3. Meanwhile, from the necessity of forming a peripheral circuit, the field oxide film 3 having compressive stress must be terminated anywhere. Accordingly, as shown in FIG. 21, the end 6 of the SiN film 2 formed by the reduced-pressure CVD process is positioned outwardly of the end position 4 of the portion where the Si substrate 1 has been partly etched away. Note that, though not shown, a peripheral driving circuit is provided below the end 6 of the SiN film 2. If the end 6 of the SiN film 2 is positioned inwardly of the end position 4 of the removed portion of the Si substrate 1 conversely to the above, tensile stress of the SiN film 2 would act through the field oxide film 3 having compressive stress and, hence, the film laminated on the field oxide film 3 would become hard to properly tense. In this embodiment, as seen from FIG. 21, the end 6 of the SiN film 2 is positioned outwardly of the terminated position 5 of the field oxide film 3 so that the end 6 of the SiN film 2 is positioned as close as possible to the Si substrate 1. As a result of manufacturing a liquid crystal display panel using such a semiconductor substrate, the laminated films were held under proper tension and showed the good mechanical strength. In addition, the panel was able to display a high-quality image stably for a long period of time.

(Embodiment 13)

Figure 26:
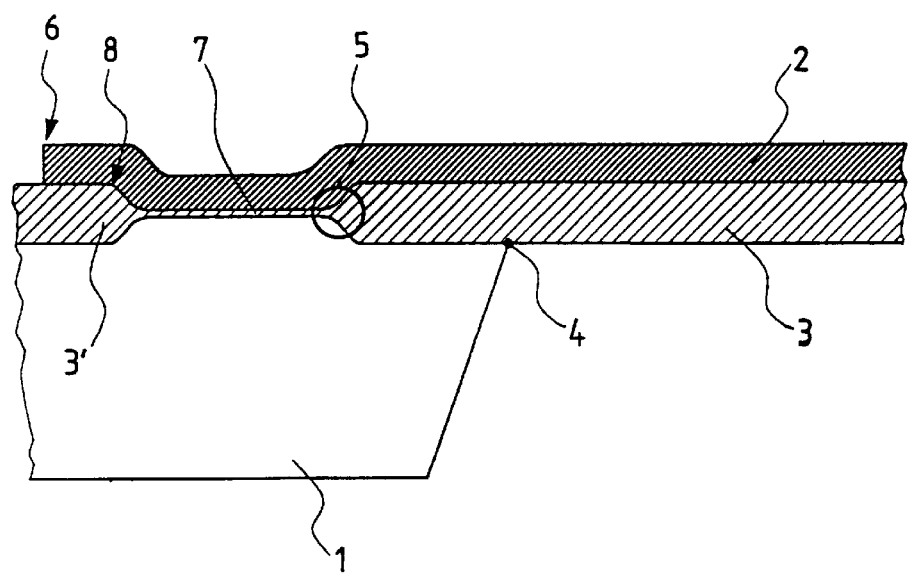
FIG. 26 is a schematic view showing still another example of a semiconductor substrate which can be applied to the display device of the present invention.
Figure 27:
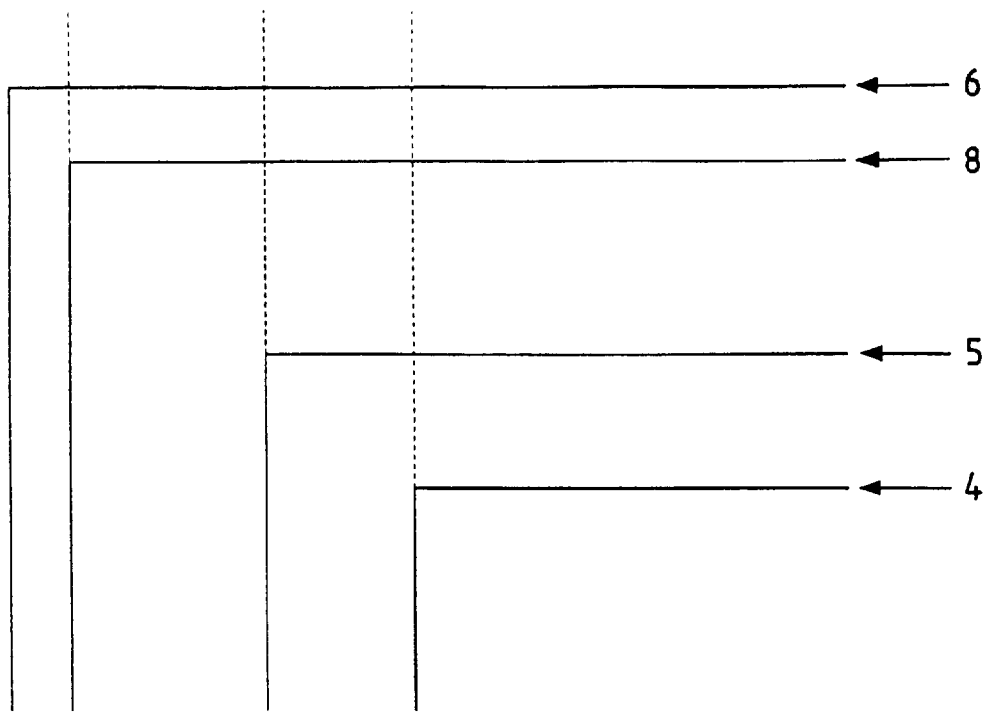
FIG. 27 is a plan view of FIG. 26.

A thirteenth embodiment will be described with reference to FIGS. 26 and 27. FIG. 26 schematically shows part of a semiconductor substrate. As with FIG. 21, in FIG. 26, 1 is a Si substrate, 2 is a SiN film formed by the reduced-pressure CVD process, 3 is a field oxide film, and 4 is an end position of the portion of the TFT substrate (semiconductor substrate) where the Si substrate 1 has been partly etched away to form a transparent pixel display area. 5 denotes a portion at which the field oxide film 3 terminates. 6 denotes an end of the SiN film 2 formed by the reduced-pressure CVD process, and 7 denotes a thin oxide film. Further, 3' is a field oxide film and 8 is an edge of the field oxide film 3'. FIG. 27 is a plan view of FIG. 26 as viewed from above. The same reference numerals denote identical components to those in FIG. 26. In this embodiment, a film having tensile stress, i.e., the SiN film 2 formed by the reduced-pressure CVD process is disposed such that its end 6 extends over the field oxide film 3' beyond the thin oxide film 7. This structure enabled the two films 2 and 3 (3') to be positioned adjacent to the Si substrate 1 without causing edge damages. As a result, the field oxide films 3, 3' and the SiN film 2 were held under proper tension and good stability. A liquid crystal display panel was manufactured by using the thus-constructed semiconductor substrate in a like manner to the above Embodiment 12. The resulting display panel was superior and able to display a high-quality image stably for a long period of time.

(Embodiment 14)

Figure 28:
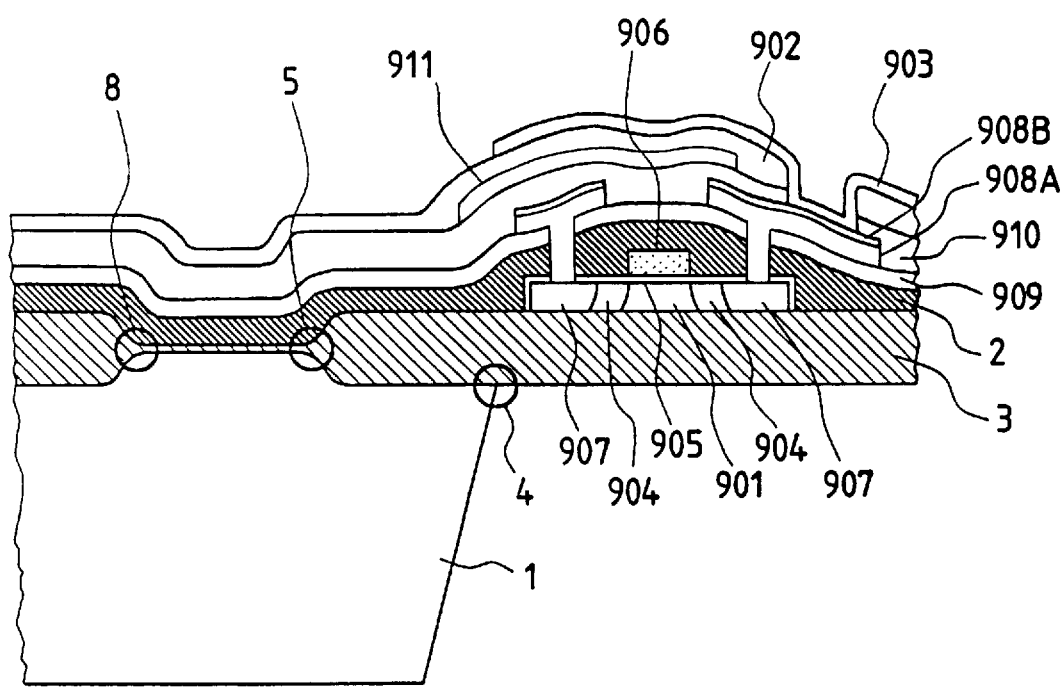
FIG. 28 is a schematic view showing still another example of a semiconductor substrate which can be applied to the display device of the present invention.

A fourteenth embodiment will be described with reference to FIG. 28. FIG. 28 schematically shows arrangements of a thin film transistor (TFT), a pixel electrode, wirings and so on which are formed the semiconductor substrate shown in FIG. 26. Referring to FIG. 28, 901 is a channel portion of the TFT, 902 is an interlayer insulating layer, and 903 is a pixel electrode (ITO). 904 is a low-concentration source/drain layer close to a gate, 906 is a gate, and 907 is a source/drain. 908A is an AlSi wiring layer, 908B is a Ti or TiN layer, and 909, 910 are interlayer insulating layers. 911 is a metal layer disposed to shield light entering the TFT and to establish a capacity between itself and the ITO 903. The other components denoted by the same reference numerals as those in FIG. 26 are the same as those in FIG. 26. In this embodiment, the SiN film 2 having tensile stress is disposed on the TFT. With the arrangement of this embodiment, since the SiN film 2 is formed over a wider area, it is easy to fix the SiN film 2 in the peripheral driving circuit area. A liquid crystal display panel was manufactured by using the thus-constructed semiconductor substrate in a like manner to the above Embodiment 12. The resulting display panel was superior and able to display a high-quality image stably for a long period of time.

The technique described in this embodiment can be applied to not only liquid crystal display devices, but also other devices which are manufactured by partly removing Si substrates, such as pressure sensors and acceleration sensors.

(Embodiment 15)

Figures 29, 30:
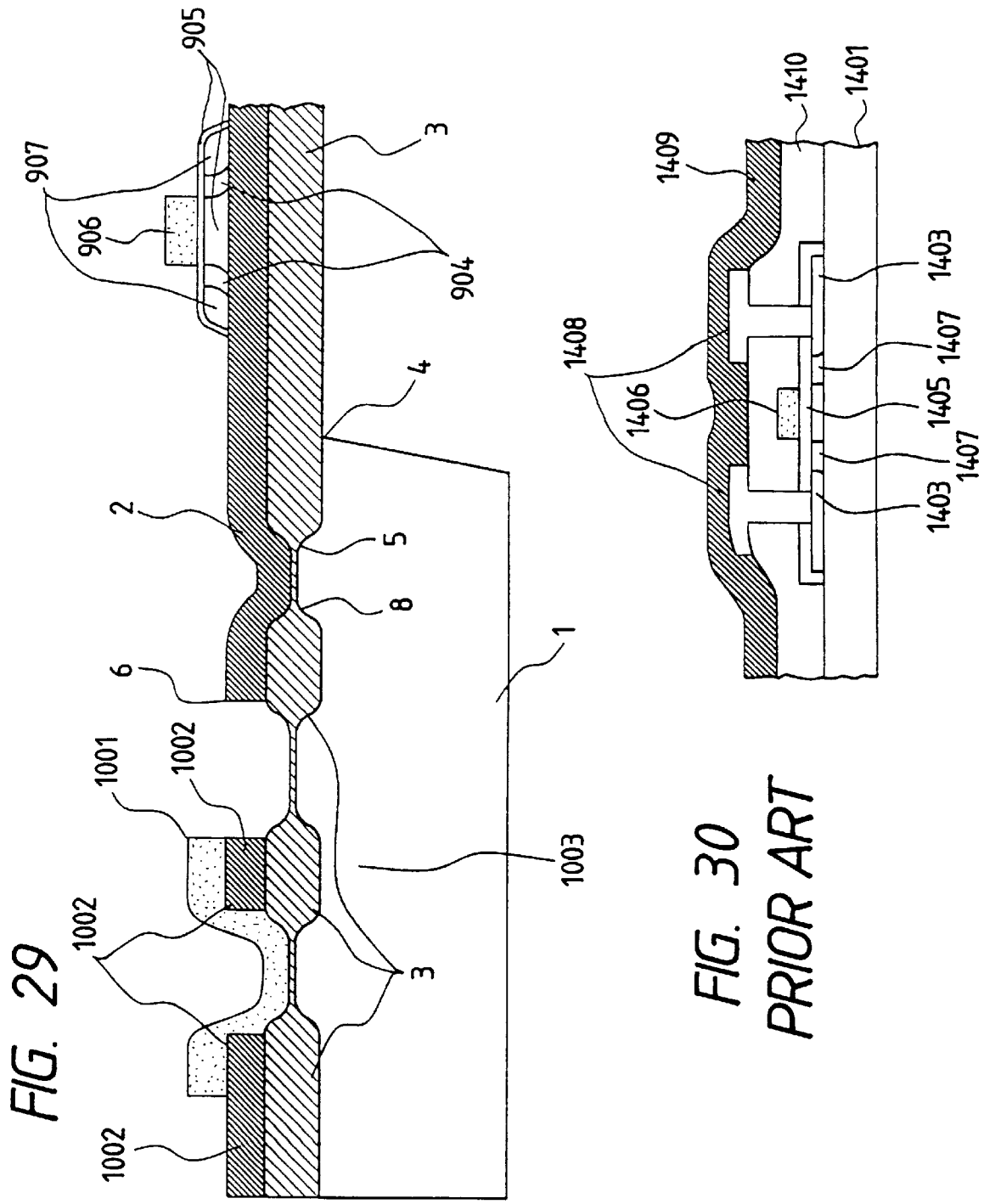
FIG. 29 is a schematic view showing still another example of a semiconductor substrate which can be applied to the display device of the present invention.
FIG. 30 is a schematic view showing one example of a structure of a prior art TFT.

A fifteenth embodiment will be described with reference to FIG. 29. FIG. 29 schematically shows part of a semiconductor substrate with a pixel electrode, wirings and so on omitted. In FIG. 29, components denoted by the same reference numerals as those in FIG. 26 or 28 are the same as those in FIG. 26 or 28. In this embodiment, a SiN film 2 formed by the reduced-pressure CVD process is disposed under the TFT, but a SiN film 1002 formed by the reduced-pressure CVD process is left on a field oxide film 3. While an end 6 of the SiN film 2 appears as being terminated at the illustrated position in FIG. 29, the SiN film 2 is actually spread over other section areas like mesh for relieving stress to increase stability. Further, as indicated by 1001, a gate of a peripheral circuit is formed on the field oxide film 3 and the SiN film 2. This structure increases an effective threshold value of a field MOS so that a high-concentration impurity layer which is usually formed as a channel stop layer in a region 1003 may be dispensed with. Thus, this embodiment enabled the MOS structure having higher resistance to be produced by simplified manufacture steps. A liquid crystal display panel was manufactured by using the thus-constructed semiconductor substrate in a like manner to the above Embodiment 12. The resulting display panel was superior and able to display a high-quality image stably for a long period of time. Consequently, this embodiment can provide a display device which has the good mechanical strength and can stably display a high-quality image.

What is claimed is:

1. A display device having a display area in which plural pixels are arranged and a peripheral portion comprising:

a silicon substrate;

a LOCOS oxide film formed on at least a portion of said silicon substrate corresponding to the display area by oxidizing a surface of said silicon substrate;

a film having tensile stress formed on said LOCOS oxide film;

plural thin film transistors formed on said film having tensile stress, corresponding to the plural pixels;

plural pixel electrodes electrically connected with said plural thin film transistors;

an opposite substrate located face to face with said silicon substrate; and a liquid crystal held between said silicon substrate and said opposite substrate, wherein said silicon substrate is partially removed at said display area.

2. The display device according to claim 1, wherein said film having tensile stress comprises silicon nitride.

3. The display device according to claim 2, wherein said film having tensile stress is formed by reduced-pressure CVD process.

4. The display device according to claim 3, wherein said thin film transistor comprises polycrystalline silicon, and a film for supplying hydrogen to the thin film transistor is formed on said thin film transistor.

5. The display device according to claim 4, wherein said film for supplying hydrogen to said thin film transistor comprises a silicon nitride film formed by plasma CVD process.

6. The display device according to claim 4, wherein the following equations are satisfied:

$$n_1 d_1 = N_1 \lambda/2$$

$$n_2 d_2 = N_2 \lambda/2,$$

wherein $n_1$ and $n_2$ are optical refractive indices of said film having tensile stress and said film for supplying hydrogen to the thin film transistor, $d_1$ and $d_2$ are respective thicknesses of said films, $\lambda$ is a wavelength of light, and $N_1$ and $N_2$ are natural numbers not equal to 0.

7. The display device according to claim 1, further comprising a driving circuit for driving said thin film transistors formed in a portion of said silicon substrate corresponding to the peripheral portion.

8. The display device according to claim 1, wherein a border of said LOCOS oxide film is located on a portion of said silicon substrate outside of an edge produced by the partial removal of said silicon substrate at said display area, and a border of said film having tensile stress is located outside an edge of said LOCOS oxide film.

* * * * *

UNITED STATES PATENT AND TRADEMARK OFFICE
CERTIFICATE OF CORRECTION

PATENT NO. : 5,815,223
DATED : September 29, 1998
INVENTOR(S) : TAKANORI WATANABE ET AL.

It is certified that error appears in the above-identified patent and that said Letters Patent is hereby corrected as shown below:

On the title page,

Item [56] References Cited, "Walter Malinowki" should read --Walter Malinowski--.

COLUMN 4

Line 21, "an other" should read --another--.

COLUMN 6

Line 28, "is is" should read --is--.
Line 34, "0)" should read --0).--.

COLUMN 12

Line 59, "Al2O3" should read --$Al_2O_3$--.

COLUMN 15

Line 46, "0)" should read --0).--.
Line 64, "an other" should read --another--.

UNITED STATES PATENT AND TRADEMARK OFFICE
CERTIFICATE OF CORRECTION

PATENT NO. : 5,815,223
DATED : September 29, 1998
INVENTOR(S) : TAKANORI WATANABE ET AL.

It is certified that error appears in the above-identified patent and that said Letters Patent is hereby corrected as shown below:

<u>COLUMN 16</u>

Line 4, "such" should read --to such--.
    Line 8, "such" should read --to such--.

<u>COLUMN 19</u>

Line 24, "the" should be deleted.

Signed and Sealed this

Sixth Day of July, 1999

Attest:

Q. TODD DICKINSON

*Attesting Officer*    *Acting Commissioner of Patents and Trademarks*